United States Patent
Asaoka et al.

(10) Patent No.: US 9,594,194 B2
(45) Date of Patent: Mar. 14, 2017

(54) LIGHT DIFFUSION MEMBER, LIGHT DIFFUSION MEMBER WITH POLARIZING PLATE, AND METHOD FOR FABRICATION OF LIGHT DIFFUSION MEMBER WITH POLARIZING PLATE

(71) Applicant: Sharp Kabushiki Kaisha, Osaka-shi, Osaka (JP)

(72) Inventors: Yasushi Asaoka, Osaka (JP); Tsuyoshi Maeda, Osaka (JP); Emi Yamamoto, Osaka (JP); Toru Kanno, Osaka (JP); Shohei Katsuta, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 14/762,886

(22) PCT Filed: Jan. 28, 2014

(86) PCT No.: PCT/JP2014/051739
§ 371 (c)(1),
(2) Date: Jul. 23, 2015

(87) PCT Pub. No.: WO2014/119532
PCT Pub. Date: Aug. 7, 2014

(65) Prior Publication Data
US 2015/0369972 A1 Dec. 24, 2015

(30) Foreign Application Priority Data
Jan. 30, 2013 (JP) ................................. 2013-015726

(51) Int. Cl.
*G02B 5/00* (2006.01)
*G02B 5/02* (2006.01)
(Continued)

(52) U.S. Cl.
CPC ............. *G02B 5/0257* (2013.01); *G02B 5/00* (2013.01); *G02B 5/02* (2013.01); *G02B 5/0247* (2013.01);
(Continued)

(58) Field of Classification Search
CPC .......... G02B 5/0257; G02B 5/00; G02B 5/02; G02B 5/0247; G02B 5/0294; G02B 5/3033;
(Continued)

(56) References Cited

U.S. PATENT DOCUMENTS

2006/0181901 A1* 8/2006 Sakai ................... G02B 6/0096
362/613
2009/0051848 A1* 2/2009 Minoura ............... G02F 1/1335
349/62
(Continued)

FOREIGN PATENT DOCUMENTS

JP 2000-352608 A 12/2000
JP 2004-070345 A 3/2004
(Continued)

OTHER PUBLICATIONS

Official Communication issued in International Patent Application No. PCT/JP2014/051739, mailed on Mar. 4, 2014.
(Continued)

*Primary Examiner* — Bumsuk Won
*Assistant Examiner* — William R Alexander
(74) *Attorney, Agent, or Firm* — Keating & Bennett, LLP

(57) ABSTRACT

A light diffusion member includes a substrate having light transmissivity, a plurality of light shielding layers, and light diffusion portions. The light diffusion portions have a light-emitting end surface, a light incident end surface which has a larger area than the area of the light-emitting end surface, and a reflecting face. Light which enters from the light
(Continued)

incident end surface is anisotropically diffused in an azimuth direction seen from a normal direction of the substrate, and the height from the light incident end surface to the light-emitting end surface of the light diffusion portion is greater than the thickness of the light shielding layers. A hollow portion of the light diffusion portion is formed in the formation region of the light shielding layers, and air is present in the hollow portion.

11 Claims, 27 Drawing Sheets

(51) Int. Cl.
  *G02F 1/1335* (2006.01)
  *G02B 5/30* (2006.01)
  *G03F 7/20* (2006.01)

(52) U.S. Cl.
  CPC ......... *G02B 5/0294* (2013.01); *G02B 5/3033* (2013.01); *G02F 1/1335* (2013.01); *G02F 1/133504* (2013.01); *G02F 1/133512* (2013.01); *G02F 1/133524* (2013.01); *G03F 7/20* (2013.01); *Y10T 156/1052* (2015.01)

(58) Field of Classification Search
  CPC ............. G02F 1/1335; G02F 1/133504; G02F 1/133512; G02F 1/133524
  USPC ........................................ 359/599, 601, 602
  See application file for complete search history.

(56) References Cited

U.S. PATENT DOCUMENTS

| | | | |
|---|---|---|---|
| 2009/0128918 A1* | 5/2009 | Abu-Ageel | G02B 6/0001 359/602 |
| 2009/0244447 A1 | 10/2009 | Hou et al. | |
| 2011/0285922 A1 | 11/2011 | Ikuta | |
| 2012/0224355 A1* | 9/2012 | Umenaka | G02B 5/003 362/97.1 |
| 2016/0018572 A1* | 1/2016 | Katsuta | G02F 1/133504 349/112 |

FOREIGN PATENT DOCUMENTS

| | | |
|---|---|---|
| JP | 2004-341310 A | 12/2004 |
| JP | 2000-241609 A | 9/2009 |
| JP | 2009-237418 A | 10/2009 |
| WO | 2010/084649 A1 | 7/2010 |
| WO | 2012/081410 A1 | 6/2012 |
| WO | 2012/157512 A1 | 11/2012 |

OTHER PUBLICATIONS

Katsuta et al., "Optical Design of Novel Microstructure Film for Wide Viewing TN-LCD," Dec. 6, 2013, 2 pages.

Yamamoto et al., "Novel Microstructure Film for Improving Viewing Angle Characteristics of LCD," Dec. 6, 2013, 2 pages.

Asaoka et al., "Roll-to-Roll Fabricated Self-Alignment Microstructure Film for Improving the Viewing-Angle Characteristics of LCD," Dec. 6, 2013, 2 pages.

* cited by examiner

40H

40I

40J

40K

40L

LIGHT DIFFUSION MEMBER, LIGHT DIFFUSION MEMBER WITH POLARIZING PLATE, AND METHOD FOR FABRICATION OF LIGHT DIFFUSION MEMBER WITH POLARIZING PLATE

TECHNICAL FIELD

The present invention relates to a light diffusion member, a light diffusion member with a polarizing plate, and a method for fabrication of the light diffusion member with the polarizing plate.

The present application claims priority based on Japanese Patent Application No. 2013-015726 filed on Jan. 30, 2013, the entirety of which is incorporated by reference.

BACKGROUND ART

Liquid crystal display devices are in widespread use as displays for mobile electronic devices such as cellular phones and the like, televisions, personal computers, and so forth. Generally, liquid crystal display devices have excellent visibility from the front, but have a narrow viewing angle. Accordingly, various improvisations have been made to broaden the viewing angle. One such proposal is a configuration having a member to control the diffusion angle of light emitted from the display such as a liquid crystal panel or the like (hereinafter referred to as light diffusion member), attached on the viewing side of the display.

For example, PTL 1 mentioned below discloses a light diffusion sheet having cross-sectional V-shaped grooves formed in a light diffusion layer, with a light absorbing layer provided to a part of the grooves. Transparent sheets formed of polyethylene terephthalate (PET) or the like are disposed on the light entry side and light emission side of the light diffusion layer of the light diffusion sheet. Part of light perpendicularly entering the light diffusion layer exhibits total reflection at the wall faces of the grooves, and thereafter is emitted. Accordingly, light emitted from the light diffusion sheet is diffused.

CITATION LIST

Patent Literature

PTL 1: Japanese Unexamined Patent Application Publication No. 2000-352608

SUMMARY OF INVENTION

Technical Problem

However, in a case where the above-described light diffusion sheet is disposed on the light emission side of the display device, depending on the polarization state of light emitted from the display device, light entering the light diffusion layer at a relatively high incident angle is reflected at the wall faces of the grooves. This results in a problem where contrast is lower and display quality is lower.

The present invention has been made to solve the above-described problem, and accordingly it is an object thereof to provide a light diffusion member, a light diffusion member with a polarizing plate, and a method for fabrication of the light diffusion member with the polarizing plate, whereby contrast can be improved.

Solution to Problem

The following means have been employed in the present invention to achieve the above object.

(1) That is to say, a light diffusion member according to an aspect of the present invention includes: a rectangular substrate having light transmissivity; a plurality of light shielding layers formed on one face of the substrate; and light diffusion portions formed on the one face of the substrate at regions other than the regions where the light shielding layers have been formed. The light diffusion portions have a light-emitting end surface coming into contact with the substrate, a light incident end surface which faces the light-emitting end surface and has a larger area than the area of the light-emitting end surface, and a reflecting face coming into contact with the light-emitting end surface and the light incident end surface, and reflecting light entering from the light incident end surface. Light which enters from the light incident end surface is anisotropically diffused in an azimuth direction seen from a normal direction of the substrate. The height from the light incident end surface to the light-emitting end surface of the light diffusion portion is greater than the thickness of the light shielding layers. The azimuth direction where the diffusion by the light diffusion member proper is relatively strong, and any one side making up the outer shape of the substrate, are generally parallel. The planar shape of the light shielding layers seen from the normal direction of one face of the substrate is an anisotropic shape having at least a major axis and a minor axis. A hollow portion sectioned by the formation regions of the light diffusion portions is formed in the formation region of the light shielding layers, and air is present in the hollow portion.

(2) The light diffusion member according to (1) may be arranged such that the ratio of the length of the major axis of the light shielding layers as to the average length of the minor axis is 1.6 or greater.

(3) The light diffusion member according to either (1) or (2) may be arranged such that the plurality of light shielding layers have at least one of mutually difference plurality of types of sizes and shapes, as seen from the normal direction of one face of the substrate.

(4) A light diffusion member according to an aspect of the present invention includes: the light diffusion member according to any one of (1) to (3); and a polarizing plate disposed on the opposite side of the substrate from the light diffusion member. The azimuth direction where the diffusion by the light diffusion member proper is relatively strong, and a transmission axis of the polarizing plate, do not match.

(5) A method of fabricating a light diffusion member with a polarizing plate according to an aspect of the present invention includes: a process of forming a plurality of light shielding layers formed on one face of a rectangular substrate having light transmissivity; a process of forming a negative photosensitive resin layer having light transmissivity on one face of the substrate so as to cover the plurality of light shielding layers; a process of irradiating diffused light as to the negative photosensitive resin layer through the substrate at regions other than formation regions of the light shielding layers, from a face of the substrate at the opposite side face where the light shielding layers and negative photosensitive resin layer have been formed; a process of developing the negative photosensitive resin layer regarding which irradiation of the diffused light has ended, so as to form, on the one face of the substrate, light diffusion portions having a light-emitting end surface coming into contact with the substrate, a light incident end surface which faces the light-emitting end surface and has a larger area than the are of the light-emitting end surface, and a reflecting face coming into contact with the light-emitting end surface and the light incident end surface, and reflecting light entering from the light incident end surface, thereby fabricating a light diffusion substrate by which light which enters from the light incident end surface of the light diffusion member is anisotropically diffused in an azimuth direction seen from a normal direction of the substrate; and a process of fabricating a light diffusion member with a polarizing plate by bonding a polarizing plate to the light incident end surface of the light diffusion portion of the light diffusion substrate, thereby forming a bonded article, and thereafter cutting to dice the bonded article. In the process of fabricating the light diffusion member with the polarizing plate, the bonded article is cut such that the azimuth direction where the diffusion by the light diffusion substrate is relatively strong, and any one side making up the outer shape of the light diffusion member with the polarizing plate after dicing, are generally parallel.

(6) In a case of bonding to a planar member with the light diffusion member according to any one of (1) to (3), a member may be provided to the light diffusion member, disposed between the planar member and the substrate, having a refractive index between the refractive index of the planar member and the refractive index of the substrate.

The light diffusion member according to (4) may further include a member, disposed between the polarizing plate and the substrate, having a refractive index between the refractive index of the polarizing plate and the refractive index of the substrate.

(7) The light diffusion member according to any one of (1) to (4) or (6) may further include a light diffusion portion, partially formed on one face of the substrate and the opposite face.

(8) In the light diffusion member with a polarizing plate according to any one of (1) to (4) or (6), at least part of the light shielding layers at the face on the opposite side to the substrate may be covered by the light diffusion portion.

(9) In the light diffusion member according to any one of (1) to (4), (6), or (8), at least one of a reflection preventing layer, an electric charge preventing layer, a glare preventing layer, and a soiling preventing layer, may be provided on one face of the substrate and the opposite side face.

(10) In the light diffusion member according to any one of (1) to (4) and (6) to (9), the plurality of light shielding layers may have at least one of mutually difference plurality of types of sizes and shapes, as seen from the normal direction of one face of the substrate.

(11) In the light diffusion member according to any one of (1) to (4) and (6) to (10), of the plurality of hollow portions, the inclination angle of a side face of at least one hollow portion may differ from the inclination angle of a side face of another hollow portion, as seen from a cross-section where the light diffusion member has been cut at a plane including a normal direction of one face of the substrate and the azimuth direction where the diffusion by the light diffusion member is relatively strong.

(12) In the light diffusion member according to any one of (1) to (4) and (6) to (11), of the plurality of light diffusion portions, the inclination angle of a side face of at least one light diffusion portion may differ depending on location, as seen from a cross-section where the light diffusion member has been cut at a plane including a normal direction of one face of the substrate and the azimuth direction where the diffusion by the light diffusion member is relatively strong.

(13) In the method of fabricating a light diffusion member according to (5), one of black resin, black ink, ink including ultraviolet absorbing substance that absorbs ultraviolet rays, a simple metal, and a multi-layer film of a simple metal and a metal oxide, may be used as a material of the light shielding layer.

(14) A light diffusion member according to an aspect of the present invention includes: a rectangular substrate having light transmissivity; a plurality of light diffusion portions formed on one face of the substrate; and light shielding layers formed on the one face of the substrate at regions other than the regions where the light diffusion portions have been formed. The light diffusion portions have a light-emitting end surface coming into contact with the substrate, a light incident end surface which faces the light-emitting end surface and has a larger area than the are of the light-emitting end surface, and a reflecting face coming into contact with the light-emitting end surface and the light incident end surface, and reflecting light entering from the light incident end surface. Light which enters from the light incident end surface is anisotropically diffused in an azimuth direction seen from a normal direction of the substrate. The height from the light incident end surface to the light-emitting end surface of the light diffusion portion is greater than the thickness of the light shielding layers. The azimuth direction where the diffusion by the light diffusion member proper is relatively strong, and any one side making up the outer shape of the substrate, are generally parallel. The planar shape of the light diffusion portions seen from the normal direction of one face of the substrate is an anisotropic shape having at least a major axis and a minor axis. The ratio of the length of the major axis of the light shielding layers as to the average length of the minor axis may be 1.6 or greater, with present in gaps between the plurality of light diffusion portions.

(15) In the light diffusion member according to (14), the plurality of light diffusion portions may have at least one of mutually difference plurality of types of sizes and shapes, as seen from the normal direction of one face of the substrate.

(16) In the light diffusion member according to either (14) or (15), of the plurality of hollow portions, the inclination angle of a side face of at least one hollow portion may differ from the inclination angle of a side face of another hollow portion, as seen from a cross-section where the light diffusion member has been cut at a plane including a normal direction of one face of the substrate and the azimuth direction where the diffusion by the light diffusion member is relatively strong.

(17) In the light diffusion member according to any one of (14) to (16), of the plurality of light diffusion portions, the inclination angle of a side face of at least one light diffusion portion differs depending on location, as seen from a cross-section where the light diffusion member has been cut at a plane including a normal direction of one face of the substrate and the azimuth direction where the diffusion by the light diffusion member is relatively strong.

(18) A method of fabricating a light diffusion member according to an aspect of the present invention includes: a process of forming a light shielding layer having a plurality of openings, formed on one face of a rectangular substrate having light transmissivity; a process of forming a negative photosensitive resin layer having light transmissivity on one face of the substrate so as to cover the plurality of openings; a process of irradiating diffused light as to the negative photosensitive resin layer through the substrate of the openings, from a face of the substrate at the opposite side face where the light shielding layers and negative photosensitive resin layer have been formed; a process of developing the negative photosensitive resin layer regarding which irradiation of the diffused light has ended, so as to form, on the one face of the substrate, light diffusion portions having a light-emitting end surface coming into contact with the substrate, a light incident end surface which faces the light-emitting end surface and has a larger area than the area of the light-emitting end surface, and a reflecting face coming into contact with the light-emitting end surface and the light incident end surface, and reflecting light entering from the light incident end surface, thereby fabricating a light diffusion substrate by which light which enters from the light incident end surface of the light diffusion member is anisotropically diffused in an azimuth direction seen from a normal direction of the substrate; and a process of fabricating a light diffusion member with a polarizing plate by bonding a polarizing plate to the light incident end surface of the light diffusion portion of the light diffusion substrate, thereby forming a bonded article, and thereafter cutting to dice the bonded article. In the process of fabricating the light diffusion member with the polarizing plate, the bonded article may be cut such that the azimuth direction where the diffusion by the light diffusion substrate is relatively strong, and any one side making up the outer shape of the light diffusion member with the polarizing plate after dicing, are generally parallel.

(19) In the method of fabricating a light diffusion member according to (18), one of black resin, black ink, ink including ultraviolet absorbing substance that absorbs ultraviolet rays, a simple metal, and a multi-layer film of a simple metal and a metal oxide, may be used as a material of the light shielding layer.

(20) A display device according to an aspect of the present invention includes: a display; and a viewing angle enlarging member that is disposed on a viewing side of the display and emits light in a state where an angle distribution of light input from the display is wider than that before input. The viewing angle enlarging member may be configured including the light diffusion member according to any one of (1) to (3), the display may have a plurality of pixels that make up a display image, and of the plurality of light shielding layers of the light diffusion member, the largest size of the light shielding layers may be smaller than the pixel size of the display.

(21) A display device according to an aspect of the present invention includes: a display; and a viewing angle enlarging member that is disposed on a viewing side of the display and emits light in a state where an angle distribution of light input from the display is wider than that before input. The viewing angle enlarging member may be configured including the light diffusion member according to any one of (14) to (17), the display may have a plurality of pixels that make up a display image, and of the plurality of light diffusion portions of the light diffusion member, the greatest pitch between adjacent light diffusion portions may be smaller than the pitch between the pixels of the display.

Advantageous Effects of Invention

According to an aspect of the present invention, a light diffusion member with a polarizing plate and a method for fabrication of the light diffusion member with the polarizing plate, whereby contrast can be improved, can be provided. According to an aspect of the present invention, a display device having the light diffusion member with a polarizing plate, and having excellent display quality, can be provided.

DESCRIPTION OF EMBODIMENTS (First Embodiment)

A first embodiment of the present invention will be described below with reference to FIG. 1 through FIG. 18.

The present embodiment will be described by way of an example of a liquid crystal display device having a transmissive liquid crystal panel (display member) as a display device.

Note that in all of the following drawings, the dimensional scale may vary among components, to facilitate viewing of the components.

Figure 1:
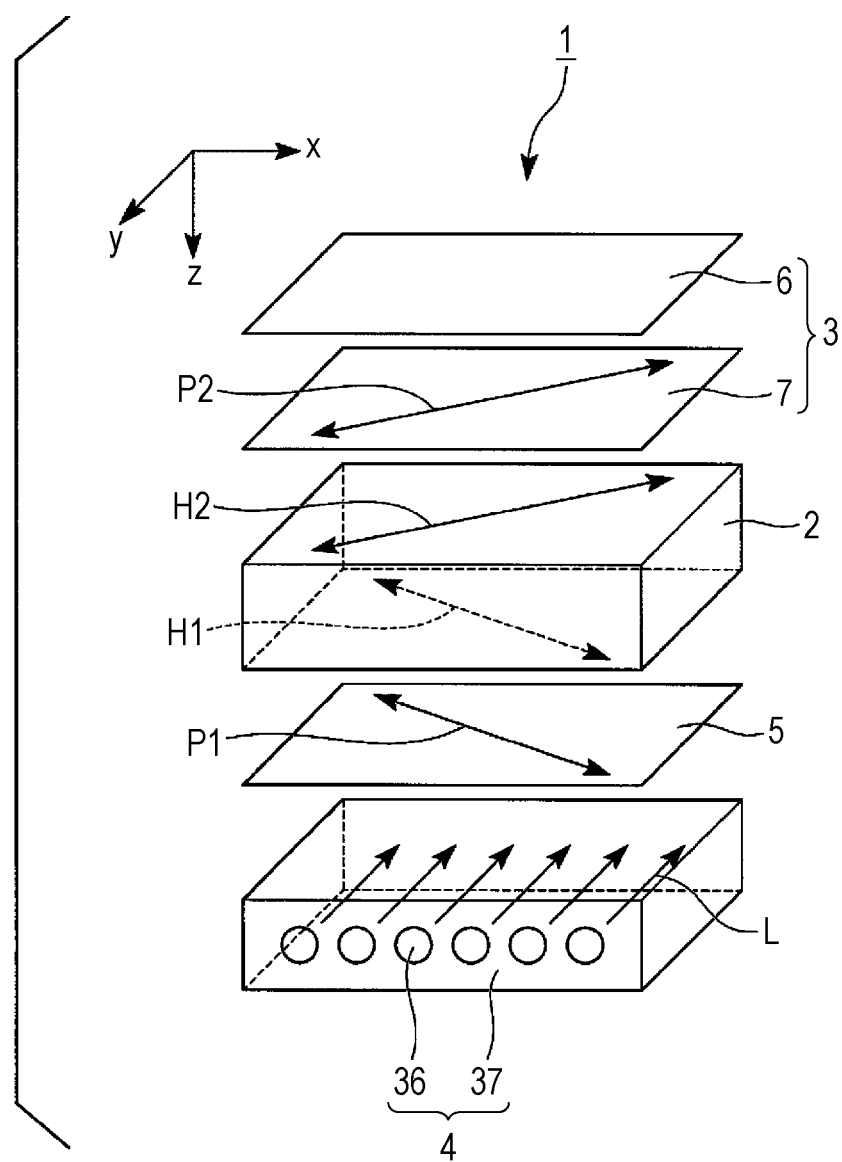
FIG. 1 is a perspective view illustrating a schematic configuration of a liquid crystal display device according to a first embodiment.
Figure 2:
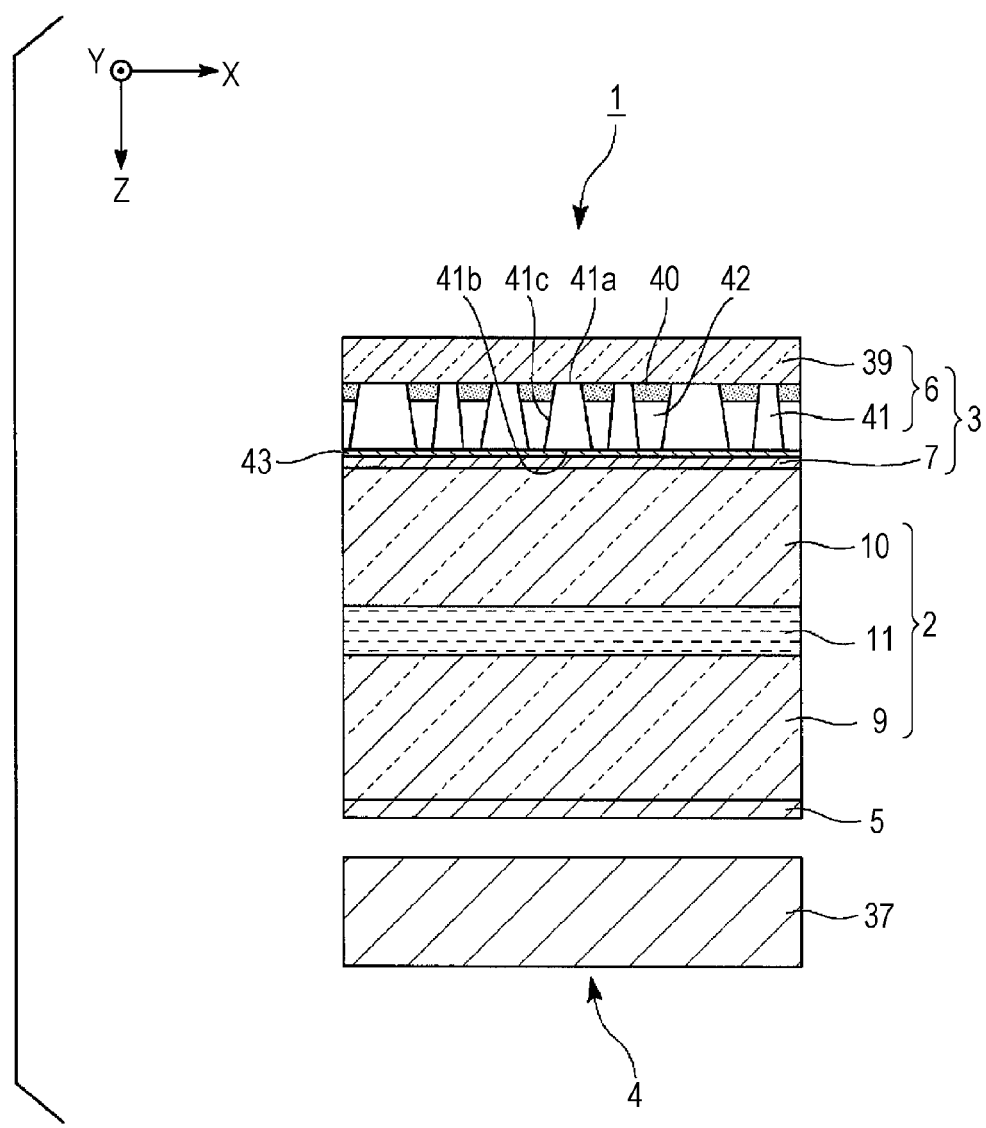
FIG. 2 is a cross-sectional diagram of the liquid crystal display device.

FIG. 1 is a perspective view a liquid crystal display device according to the present embodiment as viewed from obliquely above (viewing side). FIG. 2 is a cross-sectional diagram of the liquid crystal display device.

A liquid crystal display device 1 according to the present embodiment includes a backlight 4 (illumination device), a first polarizing plate 5, a liquid crystal panel 2, and a viewing angle enlarging member 3 (light diffusion member with polarizing plate), as illustrated in FIG. 1 and FIG. 2. The viewing angle enlarging member 3 includes a light diffusion member 6 and a second polarizing plate 7. The second polarizing plate 7 according to the present embodiment corresponds to the polarizing plate making up the "light diffusion member with polarizing plate" in the Claims.

While FIG. 1 schematically illustrates the liquid crystal panel 2 as being a single plate, the detailed structure thereof will be described later.

An observer views a display from above the liquid crystal display device 1 in FIG. 1, where the viewing angle enlarging member 3 has been disposed. In the following description, the side where the viewing angle enlarging member 3 has been disposed will be referred to as the viewing side, and the side where the backlight 4 has been disposed will be referred to as the rear face side. Also, in the following definition, the x axis is defined as a direction horizontal to the screen of the liquid crystal display device 1, the y axis as a direction perpendicular to the screen of the liquid crystal display device 1, and the z axis as the thickness direction of the liquid crystal display device 1.

Light L emitted from the backlight 4 is modulated at the liquid crystal panel 2, in the liquid crystal display device 1 according to the present embodiment, thereby displaying predetermined images, text, etc., by the modulated light. When the light emitted from the liquid crystal panel 2 passes through the viewing angle enlarging member 3, the light distribution of the omitted light (diffusion angle distribution) is in a state of being broader than when entering the viewing angle enlarging member 3, and the light is emitted from the viewing angle enlarging member 3 in this state. Thus, the observer can view the display with a wide viewing angle.

The following is a description of a specific configuration of the liquid crystal panel 2.

Description will be made here by way of an example of an active matrix transmissive liquid crystal panel. It should be noted, however, that liquid crystal panels applicable to the present invention are not restricted to active matrix transmissive liquid crystal panels. Liquid crystal panels applicable to the present invention may be a transflective (both transmitting and reflecting) liquid crystal panel, for example. Further, this may be a simple matrix liquid crystal panel where the pixels do not have thin film transistors for switching (Thin Film Transistor, hereinafter abbreviated to TFT).

Figure 3:
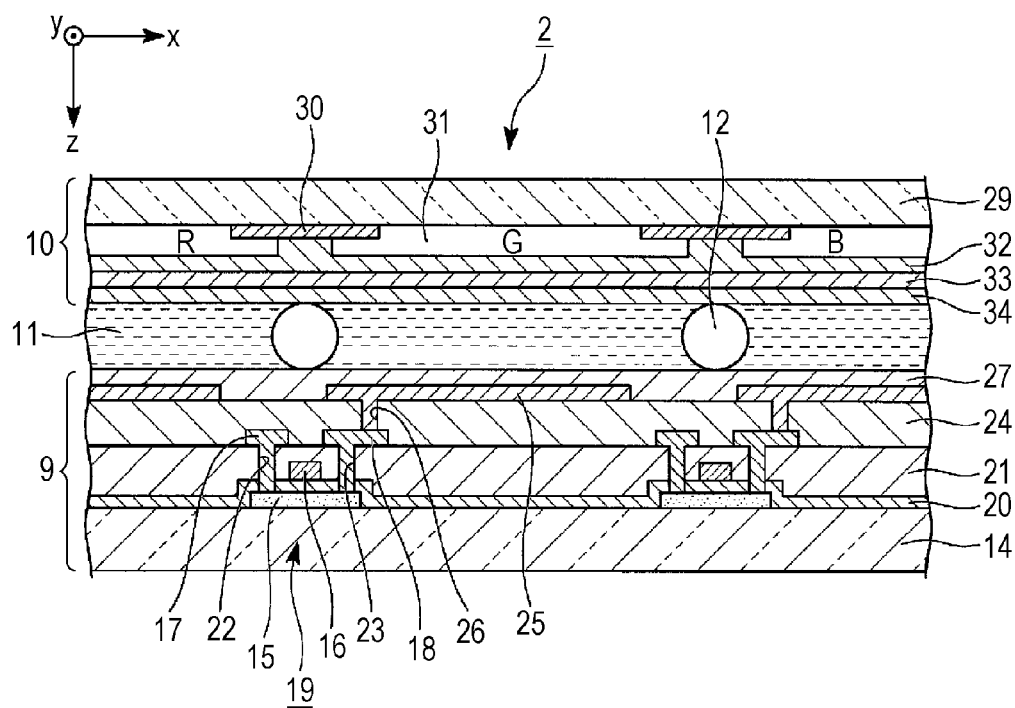
FIG. 3 is a longitudinal-section diagram of a liquid crystal panel.

FIG. 3 is a longitudinal-section diagram of a liquid crystal panel.

The liquid crystal panel 2 has a TFT substrate 9, a color filter substrate 10, and a liquid crystal layer 11, as illustrated in FIG. 3. The TFT substrate 9 functions as a switching device substrate.

The color filter substrate 10 is disposed facing the TFT substrate 9. The liquid crystal layer 11 is interposed between the TFT substrate 9 and the color filter substrate 10.

The liquid crystal layer 11 is sealed in a space surrounded by the TFT substrate 9, the color filter substrate 10, and a frame-shaped seal member (not illustrated). The TFT substrate 9 and the color filter substrate 10 are bonded to each other across the seal member, with a predetermined spacing therebetween.

The liquid crystal panel 2 according to the present embodiment performs display in TN (Twisted Nematic) mode, for example.

Liquid crystal having positive dielectric anisotropy is used for the liquid crystal layer 11. Spacers 12 are disposed between the TFT substrate 9 and the color filter substrate 10. The spacers 12 are spherical or cylindrical. The spacers 12 serve to maintain the spacing between the TFT substrate 9 and the color filter substrate 10 constant.

The display mode of the liquid crystal panel 2 according to the present invention is not restricted to the above-described TN mode. For example, VA (Vertical Alignment) mode, STN (Super Twisted Nematic) mode, IPS (In-Plane Switching) mode, FFS (Fringe Field Switching) mode, or the like, may be used.

Although no illustrated, multiple pixels are arrayed on the TFT substrate 9 in matrix fashion. A pixel is the smallest increment region of display. Multiple source bus lines are formed on the TFT substrate 9, extending parallel to each other. Multiple gate bus lines are formed on the TFT substrate 9, extending in parallel. The multiple gate bus lines are orthogonal to multiple source bus lines. The multiple source bus lines and multiple gate bus lines are formed in a lattice form on the TFT substrate 9. A rectangular region defined by adjacent source bus lines and adjacent gate bus lines is one pixel. A source bus line is connected to a source electrode 17 of a TFT 19. The gate bus line is connected to a gate electrode 16 of the TFT 19.

The face of a transparent substrate 14 making up the TFT substrate 9 facing toward the liquid crystal layer 11 has formed thereupon TFTs 19 having a semiconductor layer 15, gate electrode 16, source electrode 17, drain electrode 18, and so forth.

A glass substrate may be used for the transparent substrate 14, for example.

The semiconductor layer 15 is formed above the transparent substrate 14. Semiconductor materials such as CGS (Continuous Grain Silicon), LPS (Low-temperature Poly-Silicon), α-Si (Amorphous Silicone), and so forth, are examples of materials used for the semiconductor layer 15.

A gate insulating film 20 is formed over the transparent substrate 14 so as to cover the semiconductor layer 15.

Examples of materials used for the gate insulating film 20 include silicon oxide films, silicon nitride films, layered films thereof, and so forth.

The gate electrode 16 is formed on the gate insulating film 20 facing the semiconductor layer 15. Examples of materials used for the gate electrode 16 include a layered film of W (tungsten)/TaN (tantalum nitride), Mo (molybdenum), Ti (titanium), Al (aluminum), and so forth.

A first inter-layer insulating film 21 is formed above the gate insulating film 20, so as to cover the gate electrode 16. Examples of the material for the first inter-layer insulating film 21 include silicon oxide films, silicon nitride films, layered films thereof, and so forth.

The source electrode 17 and drain electrode 18 are formed above the first inter-layer insulating film 21. A contact hole 22 and a contact hole 23 are formed in the first inter-layer insulating film 21 and gate insulating film 20, passing through the first inter-layer insulating film 21 and gate insulating film 20.

The source electrode 17 is connected to a source region of the semiconductor layer 15 via the contact hole 22. The drain electrode 18 is connected to the drain region of the semiconductor layer 15 via the contact hole 23. A conductive material like that of the gate electrode 16 described above is used as the material for the source electrode 17 and the drain electrode 18.

A second inter-layer insulating film 24 is formed above the first inter-layer insulating film 21, so as to cover the source electrode 17 and the drain electrode 18. The material used for the second inter-layer insulating film 24 is a material like the first inter-layer insulating film 21 described above, or an organic insulating material.

A pixel electrode 25 is formed above the second inter-layer insulating film 24. A contact hole 26 is formed in the second inter-layer insulating film 24, passing through the second inter-layer insulating film 24. The pixel electrode 25 is connected to the drain electrode 18 via the contact hole 26. The pixel electrode 25 is connected to the drain region of the semiconductor layer 15 using the drain electrode 18 as a relay electrode.

A transparent conducting material such as ITO (Indium Tin Oxide), IZO (Indium Zinc Oxide), or the like, for example, is used as the material of the pixel electrode 25.

According to this configuration, when a scanning signal is supplied via the gate bus line and the TFT 19 goes on, an image signal supplied to the source electrode 17 via the source bus line is supplied to the pixel electrode 25 via the semiconductor layer 15 and drain electrode 18. An oriented film 27 is also formed on the entire face above the second inter-layer insulating film 24 so as to cover the pixel electrode 25. The oriented film 27 has an orientation restrictive force that causes the liquid crystal molecules making up the liquid crystal layer 11 to be aligned horizontally. The TFT 19 may be a top gate TFT illustrated in FIG. 3, or may be a bottom gate TFT.

On the other hand, a black matrix 30, a color filter 31, a planarizing layer 32, a counter electrode 33, and an oriented film 34, are sequentially formed of the liquid crystal layer 11 side of the developer container 29 making up the color filter substrate 10.

The black matrix 30 functions to shield transmission of light at inter-pixel regions. The black matrix 30 is formed of, for example, a metal such as Cr (chromium) or a multi-layer film of Cr/Cr oxide, or a photoresist where carbon particles are disposed in a photosensitive resin.

The color filter 31 includes pigments of the colors red (R), green (G), and blue (B). A color filter 31 of one of R, G, and B is disposed facing one pixel electrode 25 on the TFT substrate 9. The color filter 31 may have a multi-color configuration including the three colors of R, G, B, or more.

The planarizing layer 32 is configured using an insulating film covering the black matrix 30 and color filter 31. The planarizing layer 32 functions to reduce and smooth the steps formed by the black matrix 30 and color filter 31.

The counter electrode 33 is formed above the planarizing layer 32. A transparent conductive material the same as with the pixel electrode 25 is used as the material for the counter electrode 33.

The oriented film 34 is formed over the entire face above the counter electrode 33. This oriented film 34 has an orientation restrictive force that causes the liquid crystal molecules making up the liquid crystal layer 11 to be aligned horizontally.

Returning to FIG. 1, the backlight 4 is made up of a light source 36 such as a light-emitting diode, cold-cathode tube, or the like, and a light guide plate 37 that guides light emitted from the light source 36 to the liquid crystal panel 2. The light guide plate 37 has an emitting face that emits light toward the liquid crystal panel 2, and a rear face facing the emitting face, with multiple prisms (not illustrated) being formed on the rear face. The prisms on the rear face have two inclined faces (not shown) including a predetermined angles which are each different from each other as to the emitting face, so that the light emitted from the backlight 4 is strong in the normal line direction of display, and has high directionality.

Note that the back light 4 may be an edge light where the light source 36 is thus disposed at the edge face of the light guide plate 37, or may be a direct backlight where the light source is disposed directly under the light guide.

The backlight 4 used in the present embodiment preferably is a backlight having directionality where the emission direction of light is controller, a so-called directional backlight. Using a directional backlight where collimated or generally-collimated light is input to a light diffusion portion 41 of the light diffusion member 6 enables blurring to be reduced and further light usage efficiency to be improved. Luminance distribution of the above-described directional backlight will be described later.

The first polarizing plate 5 is disposed between the backlight 4 and the liquid crystal panel 2. The first polarizing plate 5 functions as a polarizer. The angle here is expressed in a counterclockwise manner with the positive direction of the x axis as the reference. A transmission axis P1 of the first polarizing plate 5 is set in the 135°-315° direction.

The second polarizing plate 7 is disposed on the liquid crystal panel 2 side of the viewing angle enlarging member 3, i.e., between the liquid crystal panel 2 and the light diffusion member 6. The second polarizing plate 7 functions as a polarizer. A transmission axis P2 of the second polarizing plate 7 is arranged so as to be orthogonal as to the transmission axis P1 of the first polarizing plate 5. The transmission axis P2 of the second polarizing plate 7 is set in the 45°-225° direction. The transmission axis P1 of the first polarizing plate 5 and the transmission axis P2 of the second polarizing plate 7 are in an arrangement of crossed Nicols.

Next, the light diffusion member 6 will be described in detail.

Figure 4:
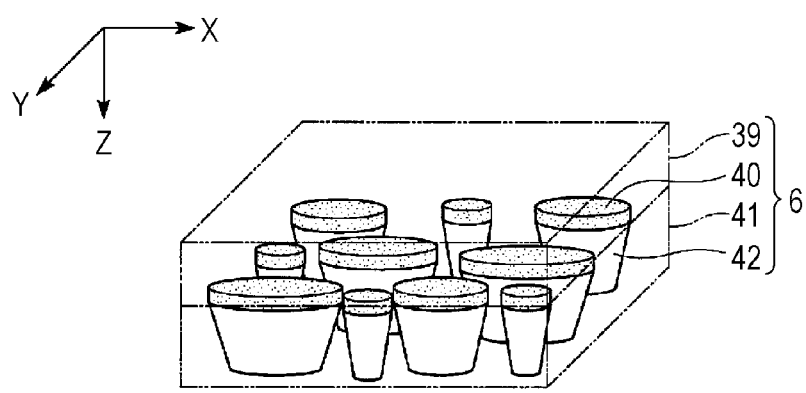
FIG. 4 is a perspective view illustrating a light diffusion member.

FIG. 4 is a perspective view illustrating the light diffusion member 6 from the viewing side.

The light diffusion member 6 includes a substrate 39, multiple light shielding layers 40, and a light diffusion portion 41, as illustrated in FIG. 4. The multiple light shielding layers 40 are formed on one face (the rear face side face) of the substrate 39. The light diffusion portion 41 is formed at a region of a face of the substrate 39 other than the regions where the light shielding layers 40 are formed.

The light diffusion member 6 is disposed on the second polarizing plate 7 assuming an attitude where the side on which the light diffusion portion 41 is provided faces toward the second polarizing plate 7 and the substrate 39 side facing toward the viewing side, as illustrated in FIG. 2. The light diffusion member 6 is fixed to the second polarizing plate 7 by an adhesive agent layer 43.

A substrate made of a transparent resin such as triacetyl cellulose (TAC) film, polyethylene terephthalate (PET), poly carbonate (PC), polyethylene naphthalate (PEN), polyether sulfone (PES) film, or the like, for example, is preferably used for the substrate 39. The substrate 39 serves as a substrate on which to apply the materials for the light shielding layers 40 and light diffusion portion 41 later in the manufacturing process. The substrate 39 needs heat resistance and mechanical strength for the thermal treatment process in the manufacturing process. Accordingly, substrates such as glass or the like may be used for the substrate 39, besides resin substrates. However, the thickness of the substrate 39 is preferably thin, to the extent that the heat resistance and mechanical strength is not sacrificed. The reason is that the thicker the substrate 39 is, the greater the risk of blurred display is. Also, the total light transmittance of the substrate 39 preferably is 90% or higher, as stipulated by JIS K7361-1. Sufficient transparency can be obtained at total light transmittance of 90% or higher.

The present embodiment uses a transparent resin substrate having a thickness of 100 μm, as one example.

The light shielding layers 40 are disposed non-periodically as viewed from the normal direction of the principal face of the subtrate 39. The light shielding layers 40 are configured using an organic material having light absorbency and photosensitivity, such as black resist, black ink, or the like, for example. Also, a metal film such as Cr (chromium) or a multi-layer film of Cr/Cr oxide or the like may be used. The organic material of which the light shielding layers 40 are made may include an ultraviolet ray absorbing material that absorbs ultraviolet rays.

The light diffusion portion 41 is configured using an organic material having light transmissivity and photosensitivity, such as acrylic resin, epoxy resin, or the like, for example. The total light transmittance of the light diffusion portion 41 preferably is 90% or higher, as stipulated by JIS K7361-1. Sufficient transparency can be obtained at total light transmittance of 90% or higher.

As illustrated in FIG. 2, the light diffusion portion 41 includes a light-emitting end surface 41a, a light incident end surface 41b, and a reflecting face 41c. The light-emitting end surface 41a is a face in contact with the substrate 39. The light incident end surface 41b is a face facing the light-emitting end surface 41a. The reflecting face 41c is a tapered side face of the light diffusion portion 41. The reflecting face 41c is a race that reflects light input from the light incident end surface 41b. The area of the light incident end surface 41b is larger than the area of the light-emitting end surface 41a.

The light diffusion portion 41 is a portion which contributes to transmission of light in the light diffusion member 6. Incident light to the light diffusion portion 41 is guided therethrough being substantially enclosed within the light diffusion portion 41 while exhibiting total reflection at the reflecting face 41c of the light diffusion portion 41, and is emitted.

The light diffusion member 6 is disposed so that the substrate 39 faces the viewing side. Accordingly, the face with the smaller area of the two opposing faces of the light diffusion portion 41 is the light-emitting end surface 41a. On the other hand, the face with the larger area is the light incident end surface 41b.

An angle of inclination of the reflecting face 41c of the light diffusion portion 41 (the angle between the light incident end surface 41b and reflecting face 41c) preferably is 75° or greater but 85° or less. In the present embodiment, the inclination angle of the reflecting face 41c of the light diffusion portion 41 is 75°. Note however, that the inclination angle of the reflecting face 41c of the light diffusion portion 41 is not restricted in particular, as long as the incident light can be sufficiently diffused when emitting from the light diffusion member 6. The inclination angle of the reflecting face 41c of the light diffusion portion 41 is constant in the present embodiment.

The height from the light incident end surface 41b to the light-emitting end surface 41a of the light diffusion portion 41 is set so as to be larger than the thickness of the light shielding layer 40. In the case of the present embodiment, the thickness of the light shielding layer 40 is around 150 nm, for example. The height from the light incident end surface 41b to the light-emitting end surface 41a of the light diffusion portion 41 is 20μ, for example. A portion surrounded by the reflecting face 41c of the light diffusion portion 41 and the light shielding layers 40 is a hollow portion 42.

Note that the refractive index of the substrate 39 and the refractive index of the light diffusion portion 41 is preferably generally equal. The reason is as follows. A case will be considered here the refractive index of the substrate 39 and the refractive index of the light diffusion portion 41 greatly differ, for example. In this case, unwanted refraction and reflection may occur at the interface of the light diffusion portion 41 and the substrate 39 when incident light from the light incident end surface 41b is emitted from the light diffusion portion 41. There is a concern in this case that there may be trouble such as a desired viewing angle cannot be obtained, the quantity of emitted light decreases, and so forth.

Air is present in the hollow portion 42 (outside of the light diffusion portions 41) in the case of the present embodiment. Accordingly, if the light diffusion portion 41 is formed of a transparent acrylic resin for example, the reflecting face 41c of the light diffusion portion 41 is an interface of the transparent acrylic resin and the air. Now, the hollow portion 42 may be filled with another low-refractive-index material. However, the difference in refractive index at the interface of the inside and outside of the light diffusion portion 41 is greatest when air is present at the outside, as compared to a case with a low-refractive-index material.

According to Snell's law, the critical angle is the smallest according to the configuration of the present embodiment, and the incident angle range of total reflection of light at the reflecting face 41c of the light diffusion portion 41 is the largest. As a result, loss of light is suppressed, and a high level of luminance can be obtained.

Note that in the present embodiment, to say that a low-reflective-index material is present means that around the light diffusion portion 41 is made to be in a low-reflective-index state, in order to enable total reflection of light. Accordingly, this includes a state of the hollow portion 42 being filled with an inert gas such as nitrogen or the like instead of air. Alternatively, this may be a state where in side of the hollow portion 42 is a vacuum or is depressurized as compared to the ambient atmosphere.

Figure 5:
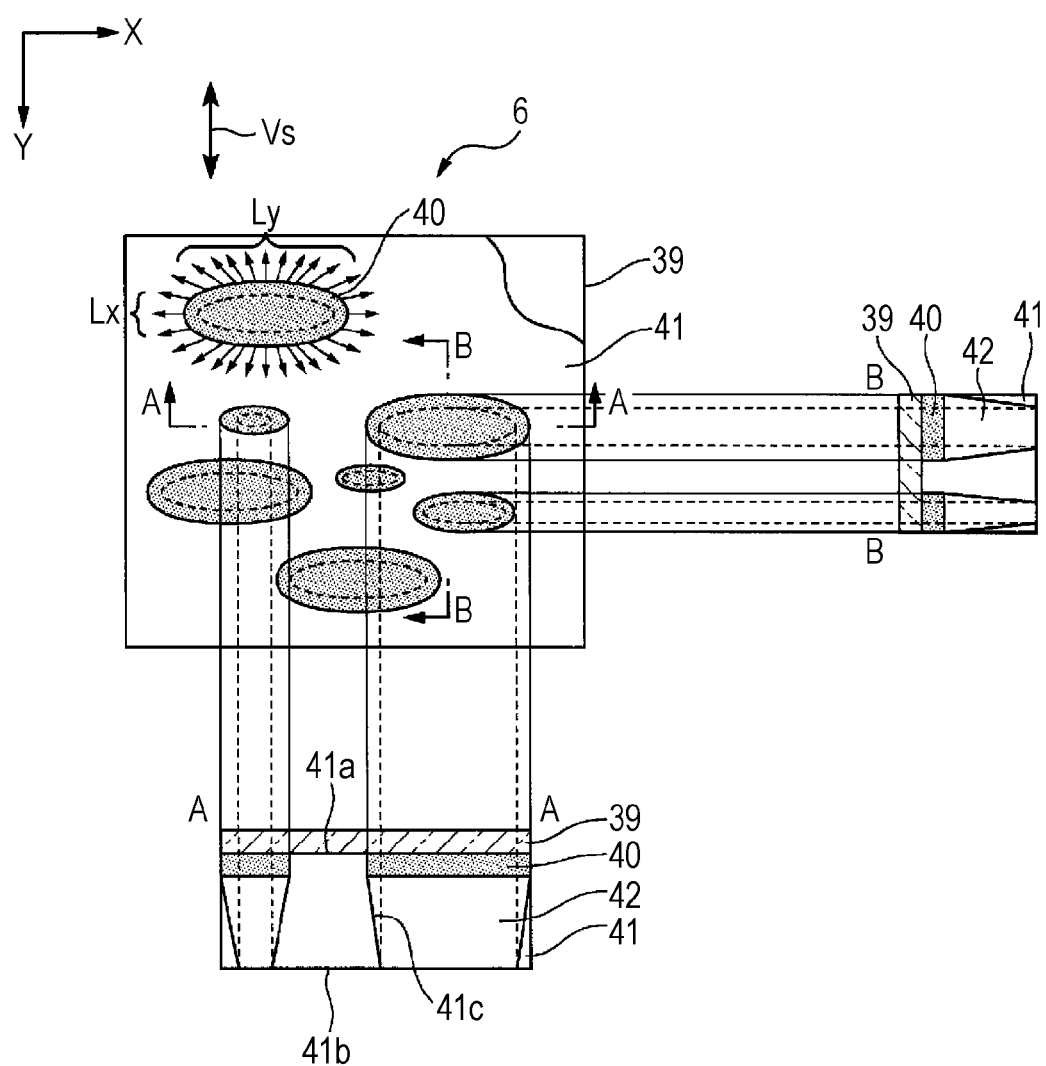
FIG. 5 is a plan view of the light diffusion member.

FIG. 5 is a schematic diagram of the light diffusion member 6. The upper left part of FIG. 5 is a plan view of the light diffusion member 6. The lower left part is a cross-sectional diagram taken along line A-A in the plan view to the upper left part. The upper right part is a cross-sectional diagram taken along line B-B in the plan view to the upper left part.

The light diffusion member 6 according to the present embodiment has multiple light shielding layers 40 provided, scattered throughout the substrate 39, as illustrated in the upper left part in FIG. 5. The light shielding layers 40 are slender ovals in planar shape as viewed from the normal direction of the substrate 39. The light shielding layers 40 each have a major axis and a minor axis. The major axis here is the longest axis in the planar shape of the light shielding layer 40 as viewed from the normal direction of the substrate 39. The minor axis is the shortest axis in the planar shape of the light shielding layer 40 as viewed from the normal direction of the substrate 39. The ratio of the length of the minor axis as to the length of the major axis in the light shielding layers 40 is generally equal in the light diffusion member 6 according to the present embodiment.

The portions equivalent to below the light shielding layers 40 are the hollow portions 42 that are elliptical frustums, as illustrated at the lower left and upper right in FIG. 5. The light diffusion member 6 has multiple hollow portions 42. The light diffusion portions 41 are arrayed continuously other than where the multiple hollow portions 42 are present.

The major axis direction of the ellipses making of the planar shape of the light shielding layers 40 (hereinafter may also be referred to as major axis direction of shielding layer) are generally arranged in the X direction in the light diffusion member 6 according to the present embodiment. The minor axis direction of the ellipses making of the planar shape of the light shielding layers 40 (hereinafter may also be referred to as minor axis direction of shielding layer) are generally arranged in the Y direction. Accordingly, taking the orientation of the reflecting faces 41c of the light diffusion portions 41 into consideration, the percentage of the reflecting faces 41c following the X direction is greater than the percentage of the reflecting faces 41c following the Y direction in the reflecting faces 41c of the light diffusion portions 41. Thus, the amount of light Ly reflecting off of the reflecting face 41c following the X direction and diffusing in the Y direction is greater than the amount of light Lx reflecting off of the reflecting face 41c following the Y direction and diffusing in the X direction.

Accordingly, the azimuthal direction Vs where the diffusion at the light diffusion member 6 is the strongest is the Y direction, which is the minor axis direction of the light shielding layers 40. The polar angle is optional. Definition of the polar angle and azimuthal angle will be described later.

Note however, that in a case where the planar shape of a light shielding layer is circular, the percentage of the reflecting face following the X axis and the percentage of the reflecting face following the Y axis are equal in the reflecting faces of the light diffusion portion. Accordingly, the light reflecting at the reflecting faces following the X direction and diffusing in the Y direction, and light reflecting at the reflecting faces following the Y direction and diffusing in the X direction, are equal. That is to say, the reflection of light off of the reflecting faces is isotropic as viewed from the normal direction of the substrate. Accordingly, there is no azimuthal direction in which the diffusion of the light diffusion member is the strongest.

Returning to FIG. 1, the orientation control direction of the oriented film 27 of the TFT substrate 9 is indicated by an arrow H1 (hereinafter referred to as orientation control direction H1). On the other hand, the orientation control direction of the oriented film 34 of the color filter substrate 10 is indicated by an arrow H2 (hereinafter referred to as orientation control direction H2).

The oriented film 27 has been subjected to orientation processing such as rubbing or the like, so that the orientation control direction H1 is the 135°-315° direction. On the other hand, the oriented film 34 has been subjected to orientation processing such as rubbing or the like, so that the orientation control direction H2 is the 45°-225° direction.

Figure 6A:
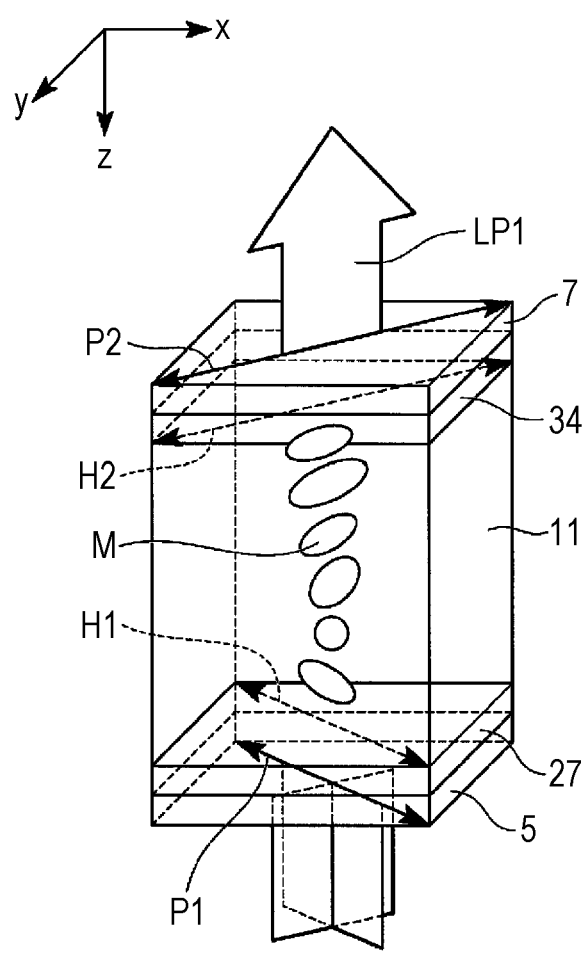
FIG. 6A is a diagram for describing effects of the liquid crystal panel.
Figure 6B:
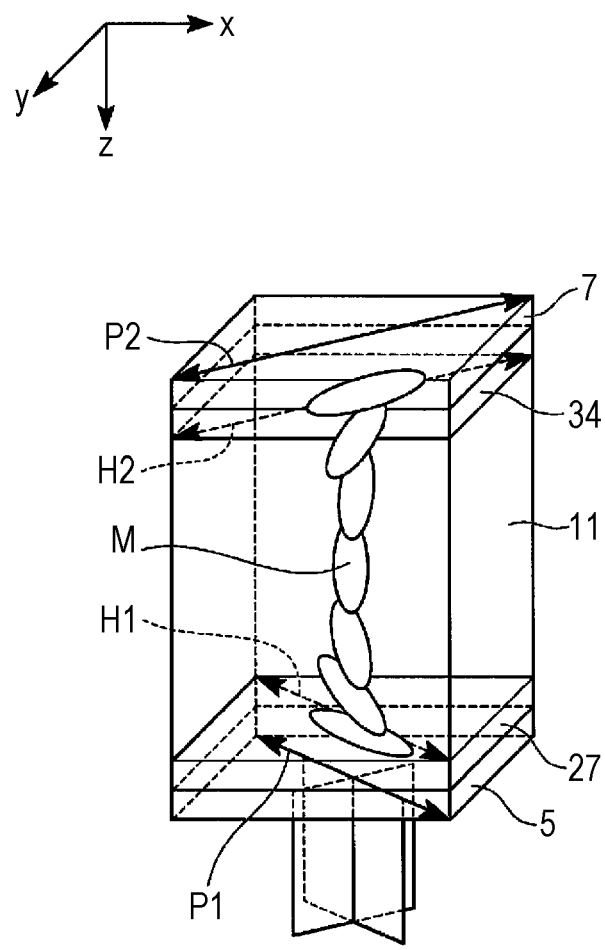
FIG. 6B is a diagram for describing effects of the liquid crystal panel.

FIG. 6A and FIG. 6B are diagrams to describe the effects of the liquid crystal panel 2.

FIG. 6A is a diagram illustrating the state of the liquid crystal panel 2 when no voltage is applied (voltage non-application state) to the liquid crystal panel 2 (between the pixel electrode 25 and counter electrode 33 illustrated in FIG. 3). FIG. 6B is a diagram illustrating the state of the liquid crystal panel 2 when a certain voltage is applied (voltage application state) to the liquid crystal panel 2. Note that the symbol M in FIG. 6A and FIG. 6B represents liquid crystal molecules making up the liquid crystal layer 11.

In the voltage non-application state illustrated in FIG. 6A, the liquid crystal molecules M are in a 90° twisted state between the oriented film 27 and the oriented film 34. At this time, the plane of polarization of linearly polarized light passing through the first polarizing plate 5 having the transmission axis P1 in the 135°-315° direction rotates 90° due to the optical rotation properties of the liquid crystal layer 11. Accordingly, the linearly-polarized light which has passed through the first polarizing plate 5 passes through the second polarizing plate 7 having the transmission axis P2 in the 45°-225° direction (LP1). Consequently, in the voltage non-application state, the display is white.

In the voltage application state illustrated in FIG. 6B, the liquid crystal molecules M are in an erect state following the direction of the electric field between the oriented film 27 and the oriented film 34. At this time, the plane of polarization of linearly polarized light passing through the first polarizing plate 5 having the transmission axis P1 in the 135°-315° direction does not rotate. Accordingly, the linearly-polarized light which has passed through the first polarizing plate 5 does not pass through the second polarizing plate 7 having the transmission axis P2 in the 45°-225° direction. Consequently, in the voltage application state, the display is black.

As described above, white display and black display can be switched by controlling application/non-application of voltage to each pixel, and thus an image can be displayed.

Figure 7:
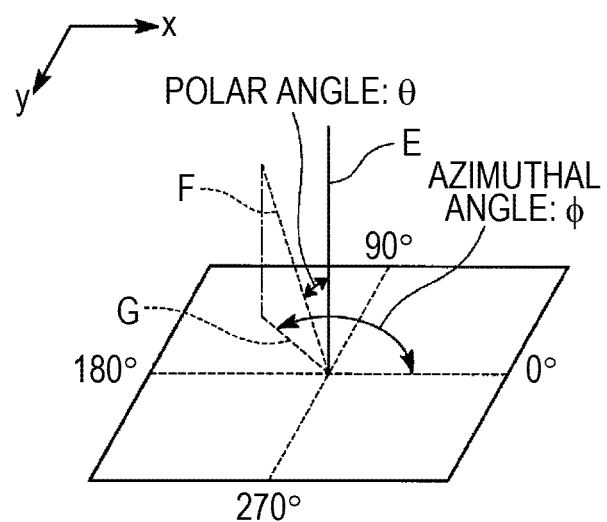
FIG. 7 is a diagram for describing definitions of polar angle and azimuthal angle.

FIG. 7 is a diagram for describing the definition of the polar angle and azimuthal angle.

As illustrated in FIG. 7, an angle between a normal direction E of the screen of the liquid crystal display device 1, serving as a reference, and a viewing direction F of an observer, is the polar angle θ. An angle between the positive direction on the x axis (direction 0°) serving as a reference and the direction of a line segment G obtained by projecting the viewing direction F of the observer on the screen, is the azimuthal angle φ.

Figure 8:
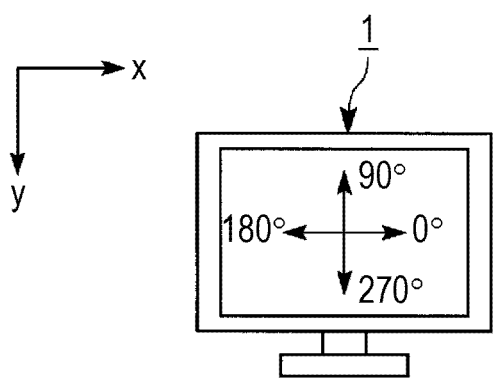
FIG. 8 is a frontal view of a liquid crystal display device.

FIG. 8 is a frontal view of the liquid crystal display device 1.

The horizontal direction (x-axis direction) of the screen of the liquid crystal display device 1 is the direction of azimuthal angle φ 0°-180°, as illustrated in FIG. 8. The direction of azimuthal angle φ 0°-180° is, simply stated, the horizontal direction. Specifically, the direction of azimuthal angle φ 0°-180° is a direction following an axis parallel to the ground. The vertical direction (y-axis direction) of the screen of the liquid crystal display device 1 is the direction of azimuthal angle φ 90°-270°. Simply put, the direction of azimuthal angle φ 90°-270° is the up-and-down direction. Specifically, the direction of azimuthal angle φ 90°-270° is a direction following an axis perpendicular to the ground.

Figure 9:
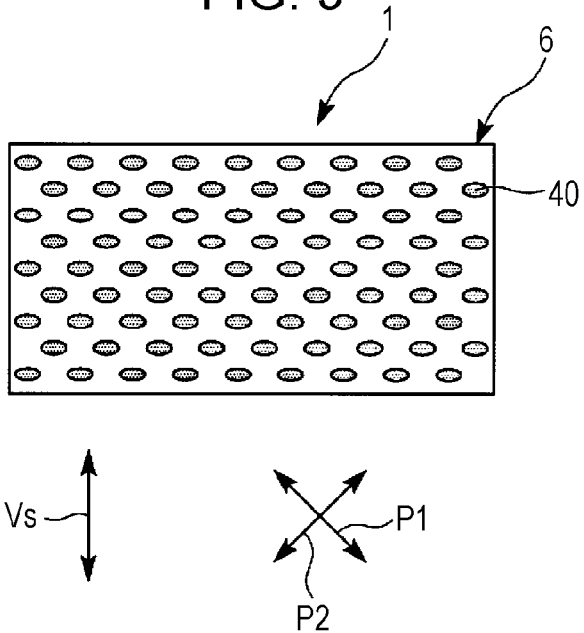
FIG. 9 is a diagram illustrating the positional relationship between an azimuthal direction in which the diffusion by the light diffusion member is relatively strong, and the transmission axes of the polarizing plates, in the frontal view of the liquid crystal display device.

FIG. 9 is a diagram illustrating the positional relationship between an azimuthal direction Vs in which the diffusion by the light diffusion member 6 is relatively strong, and the transmission axes of the polarizing plates (transmission axis P1 of the first polarizing plate 5 and transmission axis P2 of the second polarizing plate 7), in the frontal view of the liquid crystal display device 1 according to the present embodiment. Note that FIG. 9 illustrates the multiple light shielding layers 40, each being of the same size arrayed in a regular manner, for sake of convenience.

The frontal shape of the liquid crystal display device 1 according to the present embodiment is rectangular in the horizontal direction (landscape), as illustrated in FIG. 9. The azimuthal direction Vs in which the diffusion by the light diffusion member 6 is relatively strong in the present embodiment is the direction of azimuthal angle φ 90°-270°. Accordingly, the intensity of diffusion in the vertical direction of the liquid crystal display device 1 increases, so vertical visibility is further improved.

In the present embodiment, the azimuthal direction Vs in which the diffusion by the light diffusion member 6 is relatively strong, and the short side of the substrate 39 (one side) are generally parallel (matched).

That is to say, the azimuthal direction Vs in which the diffusion by the light diffusion member 6 is relatively strong, and the transmission axis P2 of the second polarizing plate 7, form a generally 45-degree angle in the present embodiment. Also, the azimuthal direction Vs in which the diffusion by the light diffusion member 6 is relatively strong, and the transmission axis P1 of the first polarizing plate 5, form a generally 45-degree angle.

Note that there is no need for the azimuthal direction Vs in which the diffusion by the light diffusion member 6 is relatively strong and the short side of the substrate 39 to be perfectly matched (parallel); it is sufficient if these are generally parallel. In a general liquid crystal display device assembly process, the rotational misalignment of positioning between the liquid crystal panel and polarization plates is considered to be within around 5°. Accordingly, a case where the azimuthal direction Vs in which the diffusion by the light diffusion member 6 is relatively strong and the short side of the substrate 39 are misaligned by around 5° is also included in the technical scope of the present invention.

(Fabrication Method of Liquid Crystal Display Device)

Figure 10:
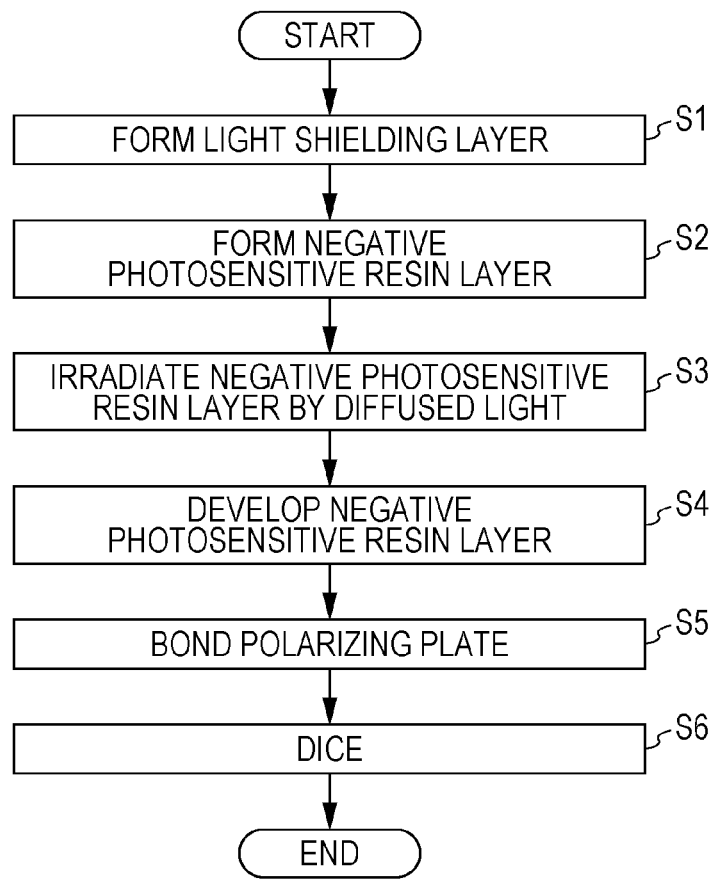
FIG. 10 is a flowchart of a method of fabrication of a light diffusion member with a polarizing plate.

FIG. 10 is a flowchart illustrating a fabrication method of the viewing angle enlarging member 3.

FIG. 11A through FIG. 11E are perspective views illustrating the manufacturing processes of the viewing angle enlarging member 3 in order.

The fabrication method of the viewing angle enlarging member 3 making up the liquid crystal display device 1 of the above-described configuration will be described, primarily regarding the fabrication processes thereof.

An overview of the fabrication process of the liquid crystal panel 2 will be described first. First, the TFT substrate 9 and the color filter substrate 10 are each fabricated. Thereafter, the face side of the TFT substrate 9 where the TFTs 19 have been formed and the face side of the color filter substrate 10 where the color filter 31 has been formed are disposed facing each other. The TFT substrate 9 and the color filter substrate 10 are then bonded together via the seal member. Thereafter, liquid crystal is filled in the space surrounded by the TFT substrate 9, the color filter substrate 10, and the seal member. The first polarizing plate 5 is then bonded to the outer face of the TFT substrate 9 side of the liquid crystal panel 2 thus formed, using an optical adhesive agent or the like. The above processes complete the liquid crystal panel 2.

The methods of fabricating the TFT substrate 9 and color filter substrate 10 may be commonly used methods, and description thereof will be omitted.

Next, the fabrication process of the viewing angle enlarging member 3 will be described.

As illustrated in FIG. 11A through 11E, the viewing angle enlarging member 3 is fabricated by various types of processing being performed by a printing device 50, a coating device 55, an exposing device 60, a developing device 65, and a polarizing plate bonding device 70, in that order.

Figure 11A:
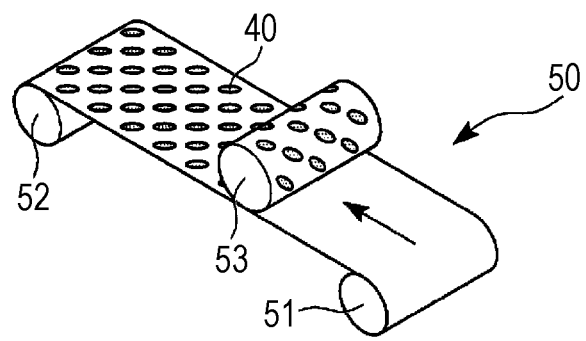
FIG. 11A is a perspective view illustrating a manufacturing procedure of the light diffusion member with a polarizing plate according to the first embodiment.

The printing device 50 conveys a long substrate roll-to-roll, and performs printing processing in the meantime, as illustrated in FIG. 11A. A feed roller 51 that feeds out the substrate is disposed at one end of the printing device 50, and a windup roller 52 that winds up the substrate is disposed on the other end. The substrate travels from the feed roller 51 side toward the windup roller 52 side in this configuration. A printing roller 53 is disposed above the substrate.

Figure 11B:
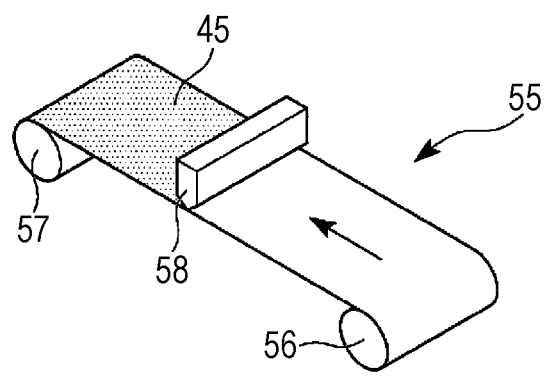
FIG. 11B is a perspective view illustrating a manufacturing procedure of the light diffusion member with a polarizing plate according to the first embodiment.

The coating device 55 conveys substrate that has been subjected to the printing processing, roll-to-roll, and performs coating processing in the meantime, as illustrated in FIG. 11B. A feed roller 56 that feeds out the substrate is disposed at one end of the coating device 55, and a windup roller 57 that winds up the substrate is disposed on the other end. The substrate travels from the feed roller 56 side toward the windup roller 57 side in this configuration. A slit coater 58 is disposed above the substrate.

Figure 11C:
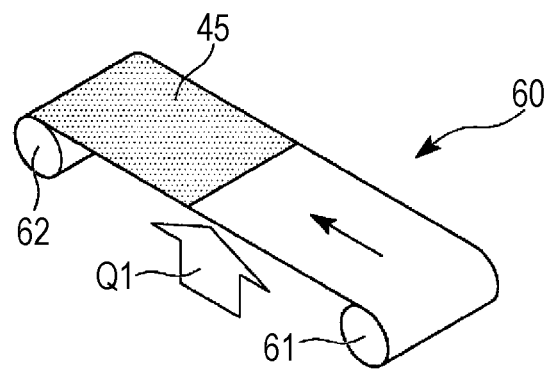
FIG. 11C is a perspective view illustrating a manufacturing procedure of the light diffusion member with a polarizing plate according to the first embodiment.

The exposing device 60 conveys substrate that has been subjected to the coating processing, roll-to-roll, and performs exposing processing in the meantime, as illustrated in FIG. 11C. A feed roller 61 that feeds out the substrate is disposed at one end of the exposing device 60, and a windup roller 62 that winds up the substrate is disposed on the other end. The substrate travels from the feed roller 61 side toward the windup roller 62 side in this configuration. A light source (omitted from illustration) that emits diffused light Q1 is disposed below the substrate.

Figure 11D:
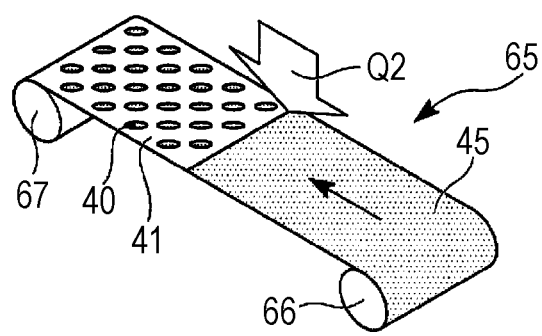
FIG. 11D is a perspective view illustrating a manufacturing procedure of the light diffusion member with a polarizing plate according to the first embodiment.

The developing device 65 conveys substrate that has been subjected to the exposing processing, roll-to-roll, and performs developing processing in the meantime, as illustrated in FIG. 11D. A feed roller 66 that feeds out the substrate is disposed at one end of the developing device 65, and a windup roller 67 that winds up the substrate is disposed on the other end. The substrate travels from the feed roller 66 side toward the windup roller 67 side in this configuration. A device (omitted from illustration) that discharge a developing fluid Q2 is disposed above the substrate.

Figure 11E:
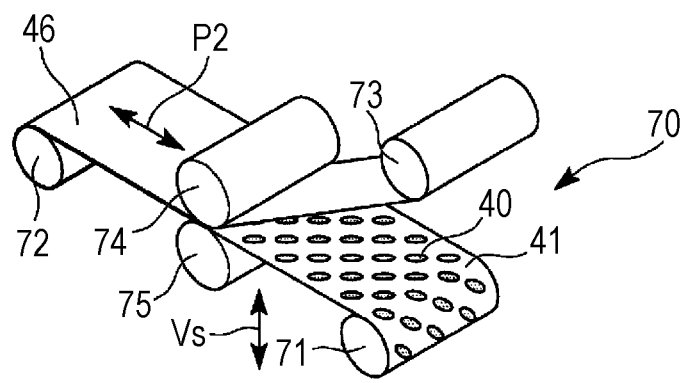
FIG. 11E is a perspective view illustrating a manufacturing procedure of the light diffusion member with a polarizing plate according to the first embodiment.

The polarizing plate bonding device 70 conveys substrate that has been subjected to the developing processing (substrate of the light diffusion member), roll-to-roll, and performs polarizing plate bonding processing (processing of bonding to the substrate of the second polarizing plate) in the meantime, as illustrated in FIG. 11E. A first feed roller 71 that feeds out the substrate is disposed at one end of the polarizing plate bonding device 70, and a windup roller 72 that winds up the substrate which has been subjected to the polarizing plate bonding processing is disposed on the other end. The substrate travels from the first feed roller 71 side toward the windup roller 72 side in this configuration. A second feed roller 73 that feeds out a substrate for the second polarizing plate is disposed above the substrate. A pair of rollers 74 and 75 to bond the substrate of the light diffusing material and the substrate of the second polarizing plate are disposed on the conveyance path of the substrate.

First, a triacetyl cellulose substrate 100 µm thick is prepared as the long substrate. Next, the printing device 50 illustrated in FIG. 11A is used to transfer a black resin including carbon as a light shielding material, or light shielding layers 40 of black ink, from the printing roller 53 onto one face of the substrate. The light shielding layers 40 are elliptical in planar shape. The printing device 50 performs printing so that the major axis direction of the light shielding layers 40 is inclined generally by 45 degrees as to the length direction of the substrate. The thickness of the light shielding layers 40 is 150 nm. Accordingly, the multiple light shielding layers 40 are formed on one face of the substrate (step S1 in FIG. 10).

The elliptical light shielding layers 40 correspond to the non-formation regions of the light diffusion portions 41 (hollow portion 42) in the next step.

The spacing (pitch) of adjacent light shielding layers 40 is neither regular nor cyclical. The spacing (pitch) of adjacent light shielding layers 40 is preferably smaller than the spacing (pitch) of pixels of the liquid crystal panel 2 (e.g., 150 µm). Accordingly, at least one light shielding layer 40 will be formed within a pixel. Thus, a wide viewing angle can be realized when combined with a liquid crystal panel having a small pixel pitch, such as those used in mobile devices and so forth, for example.

Although the light shielding layers 40 are formed by the printing method in the present embodiment, this is not restrictive. The light shielding layers 40 may also be formed by the photolithography method using a black negative resist. In this case, a positive resist having light absorption properties can be used by using a photo mask with opening patterns and light-shielding patterns inverted. Alternatively, the light shielding layers 40 may be directly formed using the vapor deposition method, ink-jet method, or the like.

The coating device 55 illustrated in FIG. 11B is used to coat one face of the substrate with a transparent negative resist made of an acrylic resin serving as a light diffusion material, so as to cover the multiple light shielding layers 40 using the slit coater 58. Thus, a 20-µm thick coated layer (negative photosensitive resin layer) 45 is formed (Step S2 in FIG. 10).

Although a transparent negative resist is formed using the slit coater in the present embodiment, this is not restrictive. A transparent negative resist may also be formed using the spin coating method, printing method, or the like.

Next, the exposing device 60 in FIG. 11C is used to irradiate the coated layer 45 by diffused light Q1, using the multiple light shielding layers 40 having elliptical planar shapes as a mask, thereby performing exposure (step S3 in FIG. 10). A exposing device is used here which uses a mixed beam of an i beam which has a wavelength of 365 nm, an h beam which has a wavelength of 404 nm, and a g beam which has a wavelength of 436 nm. The amount of exposure is 500 mJ/cm$^2$.

Next, the developing device 65 in FIG. 11D is used to develop the coated layer 45 of the transparent negative resist using a special developing fluid Q2, and post-baking is performed at 100° C., thereby forming the light diffusion portions 41 having the multiple hollow portions 42 on one face of the substrate (step S4 in FIG. 10).

Diffused light is used to perform the exposure in the present embodiment, as illustrated in FIG. 11C, so the transparent negative resist making up the coated layer is exposed radially spreading outwards from a region where the light shielding layers 40 are not formed. Accordingly, the forward-tapered hollow portions 42 are formed. The light diffusion portions 41 are reverse-tapered in their shapes. The inclination angle of the reflecting faces 41c of the light diffusion portions 41 can be controlled by the degree of diffusion of the diffused light.

The light Q1 used here may be parallel light, or diffused light, or light having intensity in a particular emission angle that is different from having intensity in a different emission angle, i.e., light having difference in intensities at particular emission angles. In a case of using parallel light, the angle of inclination of the reflecting faces 41c of the light diffusion portions 41 will be a single inclination angle of around 60° to 90° for example. In a case of using diffused light, the cross-section of the inclined face will be a curve of which the angle of inclination continuously changes. In a case of using a light having difference in intensities at particular emission angles, the inclined face will have an angle of inclination corresponding to the difference in intensities. Accordingly, the angle of inclination of the reflecting faces 41c of the light diffusion portions 41 can be adjusted. Thus, the light diffusion properties of the light diffusion member 6 can be adjusted so as to yield the intended visibility.

One way of irradiating the substrate 39 with parallel light emitted from the exposing device 60 as the diffused light Q1 is to dispose a diffusing plate having a haze value of around 50 on the optical path of light emitted from the exposing device, so that irradiation of the light is performed through the diffusing plate.

The substrate of the light diffusion member 6 (light diffusion substrate plate) is completed by the processes of 11A through 11D. The total light transmission of the light diffusion member 6 is preferably 90% or higher. Sufficient transparency can be obtained at total light transmittance of 90% or higher, and optical performance required of the light diffusion member 6 can be sufficiently exhibited. The total light transmission is as stipulated by JIS K7361-1.

Next, the polarizing plate bonding device 70 illustrated in FIG. 11E is used to bond the substrate of the second polarizing plate 7 onto the light incident end surface 41b of the light diffusion portions 41 in the substrate of the light diffusion member 6, by way of the adhesive agent layer 43 (see FIG. 2) (Step S5 in FIG. 10).

In this process, the transmission axis P2 of the second polarizing plate 7, and the length direction of the substrate of the light diffusion member 6, are made to be generally parallel. That is to say, the azimuthal direction Vs where the diffusion at the light diffusion member 6 is the strongest relatively, and the transmission axis P2 of the second polarizing plate 7, are made to intersect at a generally 45-degree angle.

The bonded article of the substrate of the light diffusion member 6 and the substrate of the second polarizing plate 7 which have been bonded together (hereinafter referred to simply as bonded article 46) is then cut, so as to dice the viewing angle enlarging member 3 into planar view sizes corresponding to the liquid crystal display device 1 (step S6 in FIG. 10).

Figure 12A:
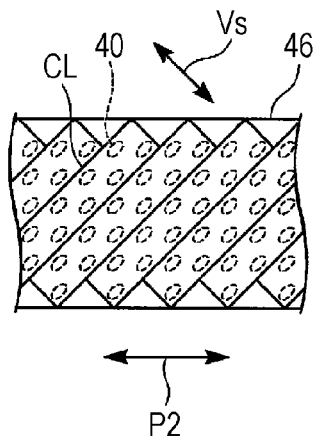
FIG. 12A is a diagram for describing a process for dicing a bonded article.
Figure 12B:
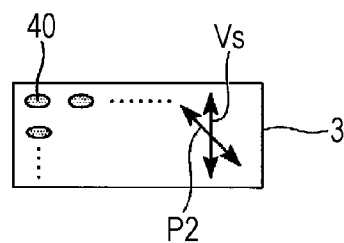
FIG. 12B is a diagram for describing a process for dicing a bonded article.

FIG. 12A and FIG. 12B are diagrams for describing the process of dicing the bonded article 46, where FIG. 12A illustrates a state before dicing, and FIG. 12B illustrates a schematic configuration plan view of a viewing angle enlarging member 3 diced from the bonded article.

In the present embodiment, the bonded article 46 is cut along an imaginary cutting line CL so that the azimuthal direction Vs in which the diffusion by the substrate of the light diffusion member 6 is relatively strong, and the short side of the outline of the viewing angle enlarging member 3 after dicing, are generally parallel (matched), as illustrated in FIG. 12A. This process completes the viewing angle enlarging member 3 according to the present embodiment. The viewing angle enlarging member 3 thus formed is in a state in which the azimuthal direction Vs where the diffusion at the light diffusion member 6 is the strongest relatively, and the transmission axis P2 of the second polarizing plate 7, intersect at a generally 45-degree angle.

Finally, the completed viewing angle enlarging member 3 is bonded to the liquid crystal panel 2 using an optical adhesive agent or the like, in a state where the substrate 39 faces the viewing side and the second polarizing plate 7 faces the liquid crystal panel 2, as illustrated in FIG. 2.

The above-described process completes the liquid crystal display device 1 according to the present embodiment. In the liquid crystal display device 1 thus fabricated, the azimuthal direction Vs in which the diffusion by the light diffusion member 6 is relatively strong, and the short side (azimuthal angle 90 degrees-270 degrees) of the outline of the liquid crystal panel 2 (liquid crystal display device 1), are generally parallel (matched).

Note that while the viewing angle enlarging member 3 is fabricated in the present embodiment by cutting the bonded article 46 where the substrate of the light diffusion member 6 and the substrate of the second polarizing plate 7 are bonded to each other, into the planar viewing size of the liquid crystal display device 1, this is not restrictive. For example, the viewing angle enlarging member 3 may be fabricated by first cutting the substrate of the light diffusion member 6 and the substrate of the second polarizing plate 7 each into the planar viewing size of the liquid crystal display device 1, and thereafter bonding the light diffusion member 6 and second polarizing plate 7 together so that the azimuthal direction Vs where the diffusion at the light diffusion member 6 is the strongest relatively, and the transmission axis P2 of the second polarizing plate 7, intersect at a generally 45-degree angle.

Also, while the viewing angle enlarging member 3 is fabricated in the present embodiment by forming the viewing angle enlarging member 3 where the second polarizing plate 7 and light diffusion member 6 are bonded to each other, and thereafter bonding this to the liquid crystal panel 2, thus forming the liquid crystal display device 1, this is not restrictive. For example, the liquid crystal display device 1 may be fabricated by cutting the substrate into the planar view size of the liquid crystal display device 1 to yield the light diffusion member 6 after the processes of FIG. 11A through FIG. 11D, and thereafter bonding this light diffusion member 6 to the liquid crystal panel 2 to which the second polarizing plate 7 has been bonded beforehand.

Now, the effects of the viewing angle enlarging member 3 according to the present embodiment will be described.

Figure 13:
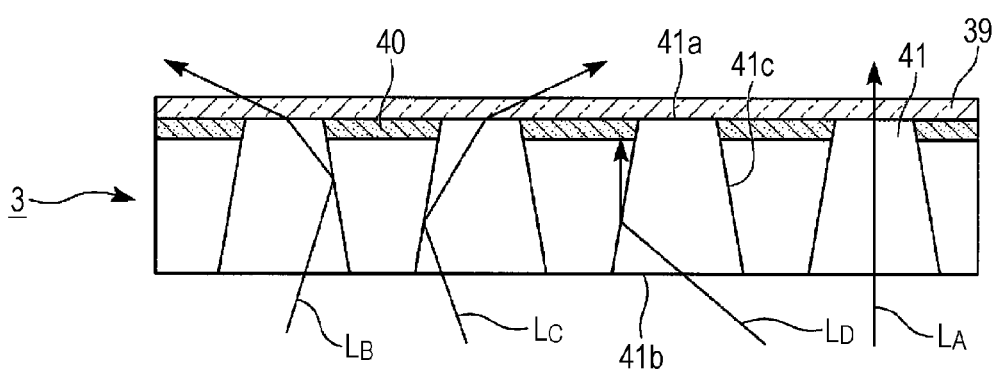
FIG. 13 is a schematic diagram for describing the effects of a viewing angle enlarging member.

FIG. 13 is a schematic diagram of describing the effects of the viewing angle enlarging member 3.

Incident light entering at an angle exceeding the critical angle exhibits total reflection at the reflecting faces 41c, passes through the light diffusion portions 41, and is emitted to the observer side, as indicated by arrows LB and LC. Incident light passing through the light diffusion portions 41 without entering the reflecting faces 41c is emitted to the observer side as it is, as indicated by arrow LA in FIG. 13. On the other hand, incident light entering at an angle equal to or smaller than the critical angle does not exhibit total reflection, and passes through the reflecting faces 41c of the light diffusion portions 41, as indicated by arrow LD in FIG. 13.

The light shielding layers 40 having light absorbing properties are provided to regions other than the light diffusion portions 41, so light that passes through the reflecting faces 41c of the light diffusion portions 41 is absorbed by the light shielding layers 40 in the case of the present embodiment. Accordingly, there is no concern of the display being blurred or contrast deteriorating due to stray light or the like. However, the greater the amount of light that passes through the reflecting faces 41c of the light diffusion portions 41 is, the less the amount of light emitted to the viewing side is, so an image with high luminance cannot be obtained.

Accordingly, a backlight having so-called directionality is used in the present embodiment as the backlight 4 emitting light at an angle so as not to enter the reflecting faces 41c of the light diffusion portions 41 at an angle equal to or smaller than the critical angle.

Figure 14A:
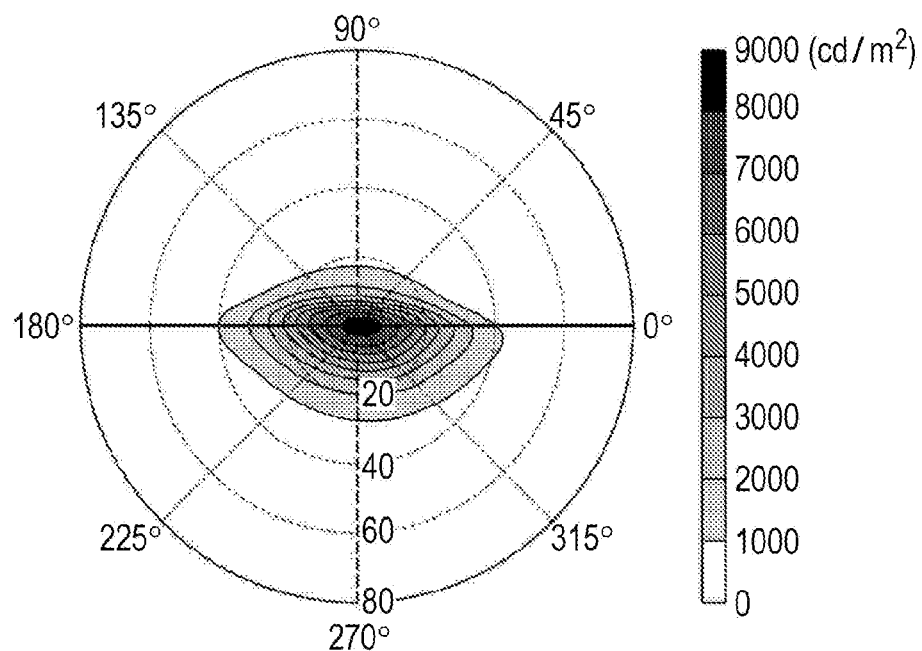
FIG. 14A is a diagram illustrating luminance distribution of a backlight.
Figure 14B:
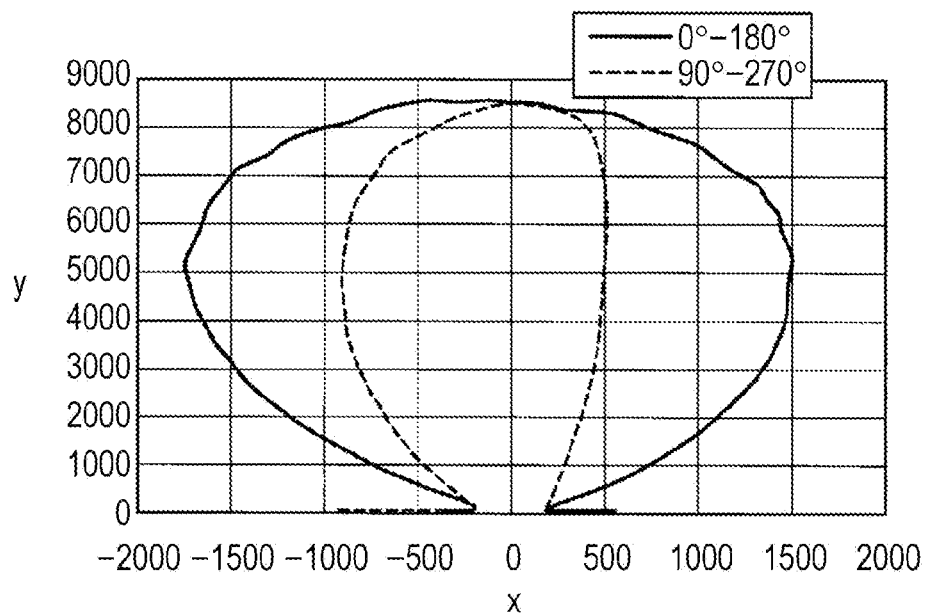
FIG. 14B is a diagram illustrating luminance distribution of the backlight as a polar coordinates diagram.

FIG. 14A illustrates the luminance distribution of the backlight 4 having anisotropic directionality, used in the present embodiment. The luminance is higher toward the center than the outer side with regard to polar angle direction, and the amount of light emitted in the azimuthal angle 90 degrees-270 degrees, indicated by dotted line in the drawing, is smaller than in the azimuthal angle 0 degrees-180 degrees, indicated by solid line in the drawing. Also, FIG. 14B illustrates the luminance distribution of the backlight 4 as a polar coordinate diagram. While the luminance distribution in the azimuthal angle 0 degrees-180 degrees, indicated by solid line in the drawing, is generally symmetrical, this is asymmetrical in the azimuthal angle 90 degrees-270 degrees, indicated by dotted line in the drawing, with less light being emitted regarding the azimuthal angle of 90 degrees as compared to the azimuthal angle of 270 degrees.

Figure 15:
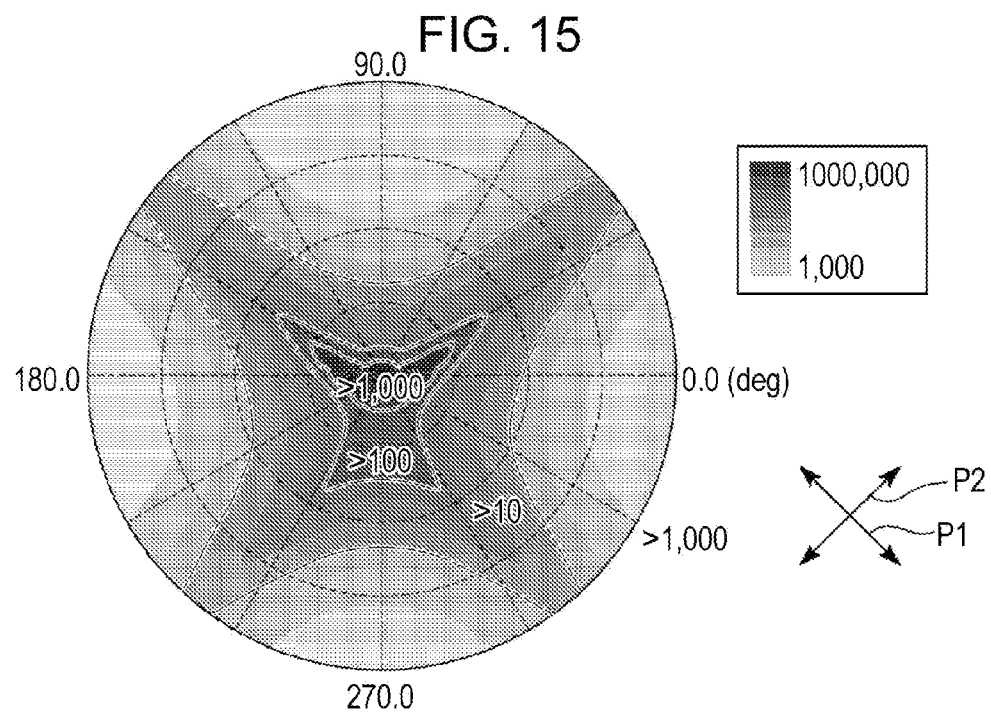
FIG. 15 is a diagram illustrating an iso-contrast curve illustrating contrast viewing angle properties when displaying white on the liquid crystal panel.

FIG. 15 is a diagram illustrating an iso-contrast curve illustrating contrast viewing angle properties when displaying white on the liquid crystal panel 2 according to the present embodiment. The contrast ratio of the liquid crystal panel 2 becomes higher as the three iso-contrast curves draw nearer to the inner side from the outer side, as illustrated in FIG. 15.

Note that the contrast ratio means the luminance value of white display/the luminance value of black display in a displayed image. The greater the contrast ratio is, the better the visibility of the displayed image can be determined to be.

The contrast ratio of the three iso-contrast curves is 10 for the first line, 100 for the second line, and 1000 for the third line, in that order from outward in. The three iso-contrast curves are all rotationally asymmetric shapes. Each of the iso-contrast curves are deviated in the azimuthal angle $\phi$: 45°-225° direction and 135°-315° direction. That is to say, the luminance peak is shifted in the direction of the transmission axis P1 of the first polarizing plate 5 and the transmission axis P2 of the second polarizing plate 7. Further, the larger the polar angle of the liquid crystal panel 2 is, the lower the contrast ratio is. That is to say, the greater the incident angle as to the light diffusion portion is, the lower the contrast ratio is.

The present embodiment can improve the brightness in the sideway directions (azimuthal angle 0 degrees-180 degrees) of the liquid crystal panel 2 having such contrast properties by combining the backlight 4 having the anisotropic luminance distribution such as described above.

Also, in the viewing angle enlarging member 3 combined with the liquid crystal panel 2 according to the present embodiment, the azimuthal direction Vs in which the diffusion by the light diffusion member 6 is relatively strong, and the short side (azimuthal angle 90 degrees-270 degrees) of the outline of the liquid crystal panel 2 (liquid crystal display device 1), are generally matched.

Accordingly, light in the liquid crystal panel 2 is diffused vertically by the viewing angle enlarging member 3. As a result, contrast is improved by the viewing angle properties being horizontally and vertically symmetrical, so the display quality of the liquid crystal display device 1 is high.

Also, the present embodiment enables a fabrication method to be provided for the viewing angle enlarging member 3 whereby the contrast can be improved. Further, the liquid crystal display device 1 having the viewing angle enlarging member 3 with excellent display quality can be provided.

It is generally known that when patterns having regularity such as stripes or grids are overlaid, interference streaks (moiré) are visually recognized if the cycle of the patterns slightly deviates. In a case where a light diffusion member where the reflecting face of multiple light diffusion portions are arrayed in a matrix, and a liquid crystal panel where multiple pixels are arrayed in a matrix, are overlaid, there is the concern that moiré will occur between the cyclic pattern of the light diffusion portions of the light diffusion member and the cyclic pattern of the pixels of the liquid crystal panel, thus deteriorating display quality.

In contrast to this, the light shielding layers 40 in the liquid crystal display device 1 according to the present embodiment are arrayed non-periodically in planar fashion. The light diffusion portions 41 are formed at regions other than where the light shielding layers 40 are formed. Accordingly, there is no occurrence of moiré due to interference with the regular array of pixels of the liquid crystal panel 2, and display quality can be maintained.

While the array of the multiple light shielding layers 40 has been described as being non-periodically in the present embodiment, the array of the multiple light shielding layers 40 does not necessarily have to be non-periodical. Occurrence of moiré can be suppressed if the array of the multiple light shielding layers 40 is non-cyclical. Further, the multiple light shielding layers 40 may be disposed cyclically, if a certain amount of moiré is permissible depending on the state and usage.

(Second Embodiment)

Figure 16:
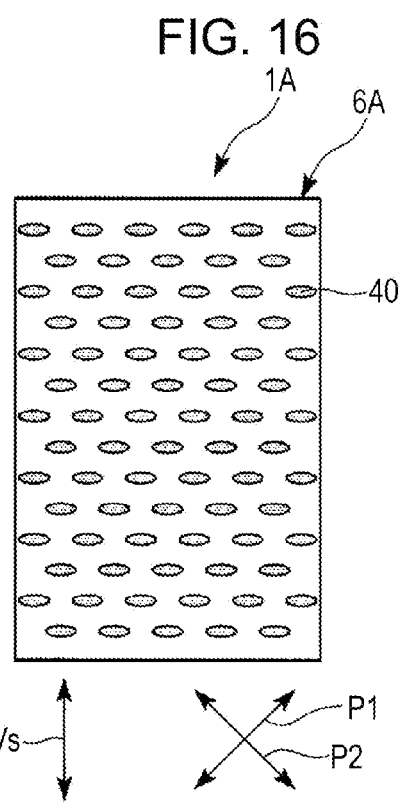
FIG. 16 is a diagram for describing effects of a light diffusion member with a polarizing plate according to a second embodiment.

FIG. 16 is a diagram illustrating the positional relationship between the azimuthal direction Vs in which the diffusion by a light diffusion member 6A is relatively strong, and the transmission axes (the transmission axis P1 of the first polarizing plate 5 and the transmission axis P2 of the second polarizing plate 7) of the polarizing plate, in a frontal view of a liquid crystal display device 1A according to a second embodiment.

The frontal shape of the liquid crystal display device 1 was a rectangular shape, long in the horizontal direction (landscape) in the first embodiment. In contrast, in the present embodiment, the frontal shape of a liquid crystal display device 1A is a rectangular shape, long in the vertical direction (portrait).

In the same way as in the first embodiment, the azimuthal direction Vs in which the diffusion by the light diffusion member 6 is relatively strong is the azimuthal angle 90 degrees-270 degrees direction in the present embodiment. Accordingly, the diffusion intensity in the vertical direction (direction of the long sides) of the liquid crystal display device 1A is great, and visibility in the vertical direction is further improved.

Also, in the present embodiment, the azimuthal direction Vs in which the diffusion by the light diffusion member 6A is relatively strong, and the transmission axis P2 of the second polarizing plate 7, are generally at a 45 degree angle, in the same way as in the first embodiment (the azimuthal direction Vs and the long sides of the outline of the liquid crystal display device 1A are generally parallel).

The viewing angle enlarging member according to the present embodiment also enables the contrast ratio to be improved. Also, a liquid crystal display device 1A having a viewing angle enlarging member and excellent display quality can be provided.

(Third Embodiment)

Figure 17:
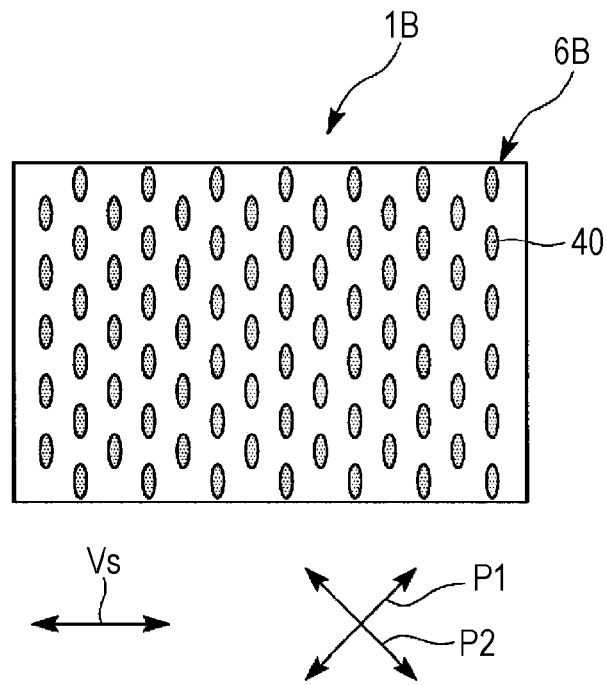
FIG. 17 is a diagram illustrating the positional relationship between an azimuthal direction in which the diffusion by the light diffusion member is relatively strong, and the transmission axis of the polarizing plate, in the frontal view of a liquid crystal display device according to a third embodiment.

FIG. 17 is a diagram illustrating the positional relationship between the azimuthal direction Vs in which the diffusion by a light diffusion member 6B is relatively strong, and the transmission axes (the transmission axis P1 of the first polarizing plate 5 and the transmission axis P2 of the second polarizing plate 7) of the polarizing plate, in a frontal view of a liquid crystal display device 1B according to a third embodiment.

The azimuthal direction Vs in which the diffusion by the light diffusion member 6 is relatively strong was the vertical direction (azimuthal angle 90 degrees-270 degrees) in the first embodiment.

In contrast with this, the azimuthal direction Vs in which the diffusion by the light diffusion member 6B is relatively strong is the horizontal angle (azimuthal angle 0 degrees-180 degrees) in the present embodiment. Also, unlike the first embodiment, the luminance distribution of the backlight 4 is the vertical direction (azimuthal angle 90 degrees-270 degrees) in the present embodiment. Accordingly, the brightness of the liquid crystal panel 2 in the vertical direction is improved in the liquid crystal display device 1B.

The frontal shape of the liquid crystal display device 1B according to the present embodiment is a rectangular shape, long in the horizontal direction (landscape), in the same way as in the first embodiment. Also, the azimuthal direction Vs in which the diffusion by the light diffusion member 6B is relatively strong, and the transmission axis P2 of the second polarizing plate 7, are generally at a 45 degree angle, in the same way as in the first embodiment (the azimuthal direction Vs and the long sides of the outline of the liquid crystal display device 1B are generally parallel).

Thus, contrast of the liquid crystal display device 1B according to the present embodiment improves due to the viewing angle properties thereof becoming vertically and horizontally symmetrical, and display quality also improves.

(Fourth Embodiment)

Figure 18:
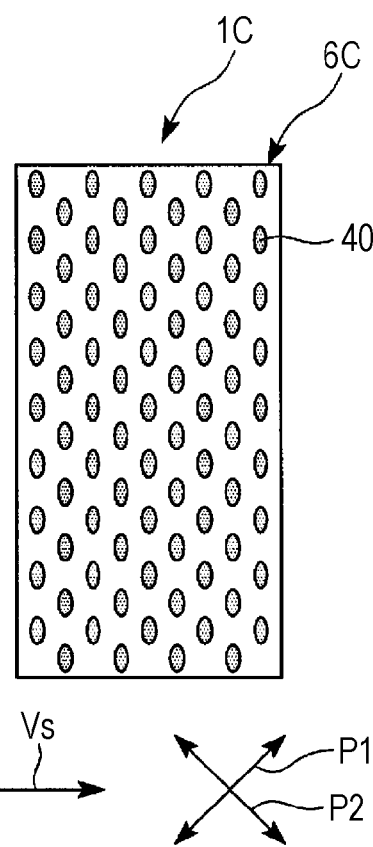
FIG. 18 is a diagram illustrating the positional relationship between an azimuthal direction in which the diffusion by the light diffusion member is relatively strong, and the transmission axis of the polarizing plate, in the frontal view of a liquid crystal display device according to a fourth embodiment.

FIG. 18 is a diagram illustrating the positional relationship between the azimuthal direction Vs in which the diffusion by a light diffusion member 6C is relatively strong, and the transmission axes (the transmission axis P1 of the first polarizing plate 5 and the transmission axis P2 of the second polarizing plate 7) of the polarizing plate, in a frontal view of a liquid crystal display device 1C according to a fourth embodiment.

The frontal shape of the liquid crystal display device 1 was a rectangular shape, long in the horizontal direction (landscape) in the first embodiment. Also, the azimuthal direction Vs in which the diffusion by the light diffusion member 6 is relatively strong was the azimuthal angle 90 degrees-270 degrees.

In contrast, in the present embodiment, the frontal shape of a liquid crystal display device 1C is a rectangular shape, long in the vertical direction (portrait).

Also, the azimuthal direction Vs in which the diffusion by the light diffusion member 6C is relatively strong is the horizontal direction (azimuthal angle 0 degrees-180 degrees). Also, like the third embodiment, the luminance distribution of the backlight 4 is the vertical direction (azimuthal angle 90 degrees-270 degrees) in the present embodiment. Accordingly, the brightness of the liquid crystal panel 2 in the vertical direction is improved in the liquid crystal display device 1C.

Also, In the present embodiment, the azimuthal direction Vs in which the diffusion by the light diffusion member 6C is relatively strong, and the transmission axis P2 of the second polarizing plate 7, are generally at a 45 degree angle, in the same way as in the first embodiment (the azimuthal direction Vs and the short sides of the outline of the liquid crystal display device 1C are generally parallel).

Thus, contrast of the liquid crystal display device 1C according to the present embodiment improves due to the viewing angle properties thereof becoming vertically and horizontally symmetrical, and display quality also improves.

(Fifth Embodiment)

A fifth embodiment of the present invention will be described.

The basic configuration of the liquid crystal display device according to the present embodiment is the same as in the first embodiment, with a point that multiple light diffusion portions 141 are disposed at a light diffusion member 106 being different from the first embodiment. Accordingly, description of the basic configuration of the liquid crystal display device will be omitted, and description will be made regarding the light diffusion member 106 in the present embodiment.

Figure 19:
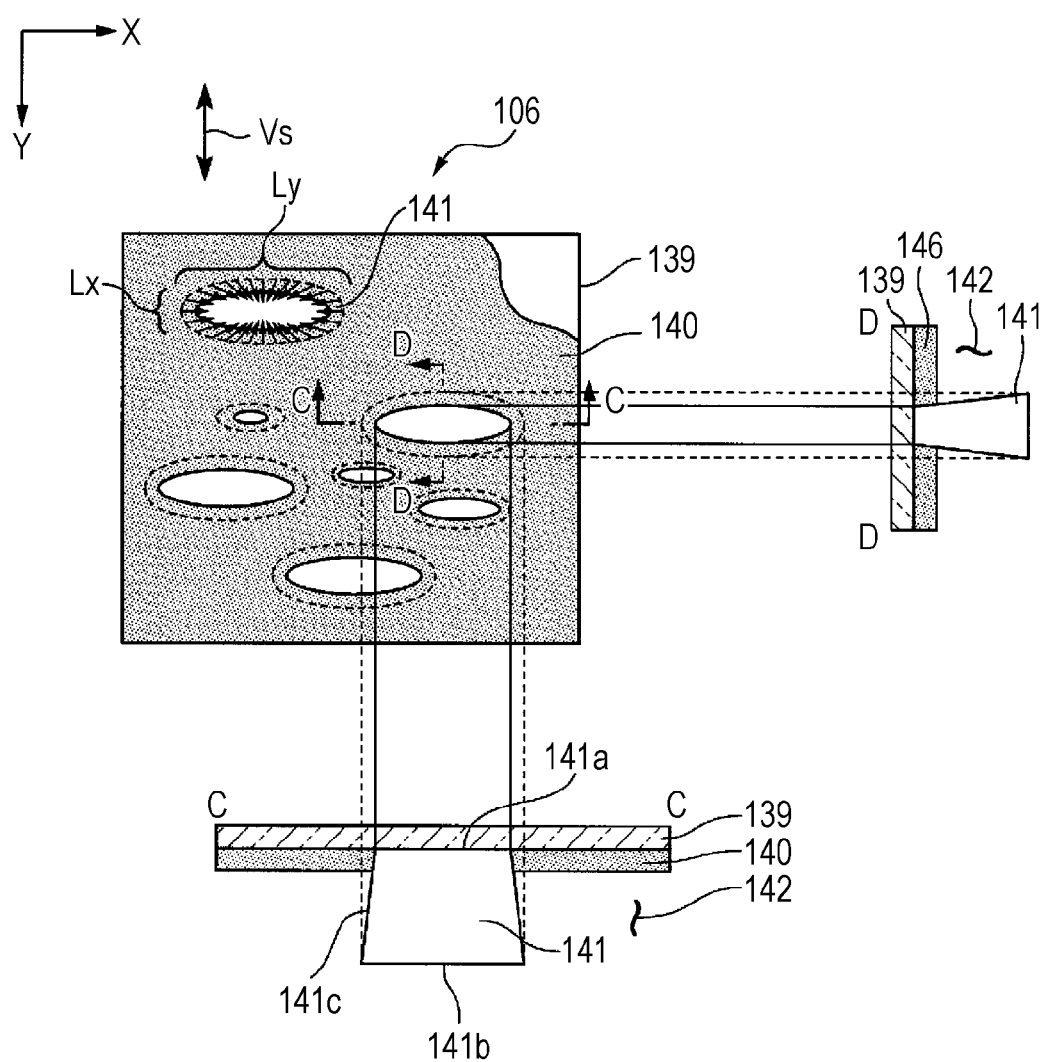
FIG. 19 is a plan view of a light diffusion member according to a fifth embodiment.

FIG. 19 is a schematic diagram of the light diffusion member 106. The upper left part of FIG. 19 is a plan view of the light diffusion member 106. The lower left part is a cross-sectional diagram taken along line C-C in the plan view to the upper left part. The upper right part is a cross-sectional diagram taken along line D-D in the plan view to the upper left part.

The first embodiment was described above as having multiple light shielding layers 40 provided, formed on one face of the substrate 39, and light diffusion portions 41 formed at regions other than the formation regions of the light shielding layers 40 on the one face of the substrate 39. The multiple light shielding layers 40 were disposed scattered on the one face of the substrate 39, with the light diffusion portions 41 formed continuously on the regions other than the formation regions of the light shielding layers 40.

In comparison, the light diffusion member 106 according to the present embodiment has multiple light diffusion portions 141 formed on one face of the substrate 139, and a light shielding layer 140 formed at regions other than the non-formation regions of the light diffusion portions 141 on the one face of the substrate 139, as illustrated to the upper left in FIG. 19. The multiple light diffusion portions 141 are formed scattered on the one face of the substrate 139, with the light shielding layer 140 formed continuously on the regions other than the formation regions of the light diffusion portions 141.

The multiple light diffusion portions 141 are disposed non-periodically (non-cyclically) as seen from the normal direction of the primary face of the substrate 139. Accordingly, the pitch between the adjacent light diffusion portions 141 is not constant.

However, the average pitch obtained by averaging the pitch between the adjacent light diffusion portions 141 is set to 25 μm.

The average spacing of adjacent light diffusion portions 141 is preferably smaller than the spacing (pitch) of pixels of the liquid crystal panel 2. Accordingly, at least one light diffusion portion 141 will be formed within a pixel, so a wide viewing angle can be realized when combined with a liquid crystal panel having a small pixel pitch, such as those used in mobile devices and so forth, for example.

Multiple openings are formed non-periodically (non-cyclically) on the substrate 139. In the present embodiment, the multiple light diffusion portions 141 are provided corresponding to the positions where the openings of the light shielding layer 140 are formed.

The light diffusion portions 141 have a shape where the cross-sectional area (elliptical shape) when cut at a plane parallel to the one face of the substrate 139 is small at the substrate 139 side, and has an elliptic conical shape that gradually becomes smaller away from the substrate 139. Of the two facing faces of the light diffusion portions 141, the face with the smaller area (the face at the side in contact with the substrate 139) is a light-emitting end surface 141a, and the face with the larger area (the face opposite the side from substrate 139) is a light incident end surface 141b.

A portion equivalent to below the light shielding layer 140 is a hollow portion 142. Air is present in the hollow portion 142. The light diffusion member 106 has a continuous hollow portion 142 where air is present.

Air is present between adjacent light diffusion portions 141 in the present embodiment, so if the light diffusion portions 41 are formed of an acrylic resin for example, a reflecting face 141c of the light diffusion portions 141 is an interface of the transparent acrylic resin and the air.

Thus, according to Snell's law, the incident angle range of total reflection of light at the reflecting face 141c of the light diffusion portions 141 is the largest. This further suppresses loss of light, and high luminance can be obtained.

Now, around the light diffusion portions 141 may be filled with another low-refractive-index material in the present embodiment to enable total reflection, and may be a state of being filled with an inert gas such as nitrogen or the like instead of air. Alternatively, this may be a state of being a vacuum or depressurized as compared to the ambient atmosphere.

As illustrated in the upper left part in FIG. 19, the light diffusion portions 141 are slender ovals in planar shape as viewed from the normal direction of the substrate 139. The light diffusion portions 141 each have a major axis and a minor axis.

The major axis direction of the light diffusion portions 141 is generally arranged in the X direction. The minor axis direction of the light diffusion portions 141 is generally arranged in the Y direction. Accordingly, taking the orientation of the reflecting faces 141c of the light diffusion portions 141 into consideration, the percentage of the reflecting faces 141c following the X direction is greater than the percentage of the reflecting faces 141c following the Y direction in the reflecting faces 141c of the light diffusion portions 141. Thus, the amount of light Ly reflecting off of the reflecting face 141c following the X direction and diffusing in the Y direction is greater than the amount of light Lx reflecting off of the reflecting face 141c following the Y direction and diffusing in the X direction.

Accordingly, the azimuthal direction Vs where the diffusion at the light diffusion member 106 is the strongest is the Y direction, which is the minor axis direction of the light shielding layers 40. The polar angle is optional.

Note however, that in a case where the planar shape of a light diffusion portion is circular, the percentage of the reflecting face following the X axis and the percentage of the reflecting face following the Y axis are equal in the reflecting faces of the light diffusion portion. Accordingly, the light reflecting at the reflecting faces following the X direction and diffusing in the Y direction, and light reflecting at the reflecting faces following the Y direction and diffusing in the X direction, are equal. That is to say, the reflection of light off of the reflecting faces is isotropic as viewed from the normal direction of the substrate. Accordingly, there is no azimuthal direction in which the diffusion of the light diffusion member is the strongest.

In the present embodiment, the azimuthal direction Vs in which the diffusion by the light diffusion member 106 is relatively strong, and the short side of the substrate 39 (one side) are generally parallel (matched), in the same way as in the first embodiment. That is to say, the azimuthal direction Vs in which the diffusion by the light diffusion member 6 is relatively strong, and the transmission axis P2 of the second polarizing plate 7, form a generally 45-degree angle.

Next, the fabrication process of the viewing angle enlarging member according to the present embodiment will be described.

The basic processes of the fabrication method of the viewing angle enlarging member according to the present embodiment are the same as in the first embodiment, differing from the first embodiment regarding the point that the light shielding layer formed on one face of the substrate in the process of forming the light shielding layer is the light shielding layer having multiple openings. Accordingly, the viewing angle enlarging member according to the present embodiment is subjected to various types of processing by processing devices in common with the processing devices described in the first embodiment. Accordingly, processing devices which are in common with the processing devices described in the first embodiment are denoted with the same reference numerals, and detailed description regarding the fabrication method in common with the fabrication method described in the first embodiment will be omitted.

Figure 20A:
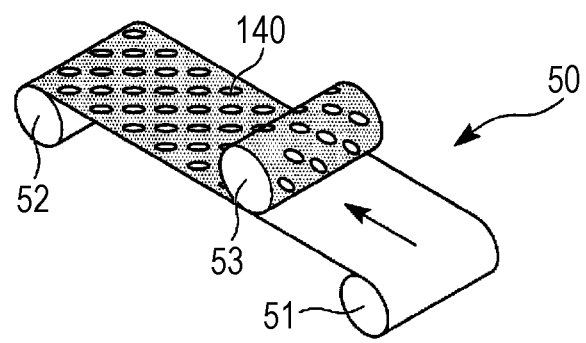
FIG. 20A is a perspective view illustrating a manufacturing procedure of the light diffusion member with a polarizing plate according to the fifth embodiment.

First, the printing device 50 illustrated in FIG. 20A is used to transfer the light shielding layer 140 having the multiple openings, formed of a formation material the same as the light shielding layers 40 described above, from the printing roller 53 onto one face of the substrate. The openings of the light shielding layer 140 are elliptical in planar shape. The thickness of the light shielding layer 140 is 150 nm. Accordingly, the light shielding layer 140 having the multiple openings is formed on one face of the substrate (step S1 in FIG. 10).

The elliptical openings correspond to the formation regions of the light diffusion portions 141 in the next process. The spacing (pitch) of openings is preferably smaller than the spacing (pitch) of pixels of the liquid crystal panel 2 (e.g., 150 μm in pitch). Accordingly, at least one light diffusion portion 141 will be formed within a pixel. Thus, a wide viewing angle can be realized when combined with a liquid crystal panel having a small pixel pitch, such as those used in mobile devices and so forth, for example.

Although the light shielding layer 140 having multiple openings is formed by the printing method in the present embodiment, this is not restrictive. The light shielding layer 140 may also be formed by the photolithography method using a black negative resist. In this case, a positive resist having light absorption properties can be used by using a photo mask with opening patterns and light-shielding patterns inverted. Alternatively, the light shielding layer 140 may be directly formed using the vapor deposition method, ink-jet method, or the like.

Figure 20B:
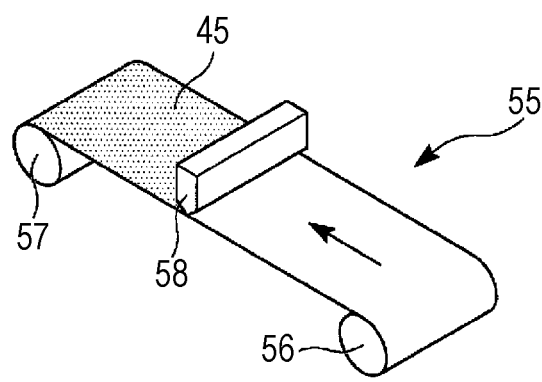
FIG. 20B is a perspective view illustrating a manufacturing procedure of the light diffusion member with a polarizing plate according to the fifth embodiment.

Next, the coating device 55 illustrated in FIG. 20B is used to coat one face of the substrate with a transparent negative resist made of an acrylic resin serving as a light diffusion material, so as to cover the multiple openings, using the slit coater 58. Thus, a 20-μm thick coated layer is formed (Step S2 in FIG. 10).

Although a transparent negative resist is formed using the slit coater in the present embodiment, this is not restrictive. A transparent negative resist may also be formed using the spin coating method, printing method, or the like.

Figure 20C:
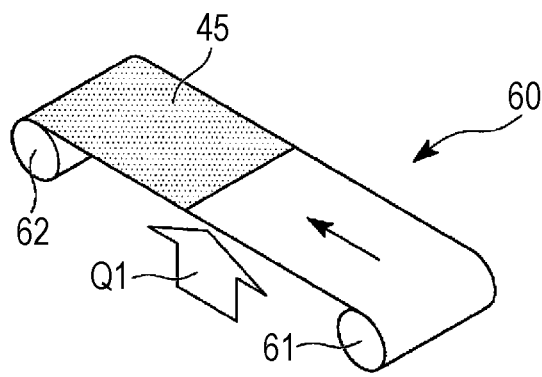
FIG. 20C is a perspective view illustrating a manufacturing procedure of the light diffusion member with a polarizing plate according to the fifth embodiment.

Next, the exposing device 60 in FIG. 20C is used to irradiate the coated layer by diffused light Q1, using the light shielding layer 140 having the multiple openings as a mask, thereby performing exposure (step S3 in FIG. 10).

An exposing device is used here which uses a mixed beam of an i beam which has a wavelength of 365 nm, an h beam which has a wavelength of 404 nm, and a g beam which has a wavelength of 436 nm. The amount of exposure is 500 mJ/cm².

Figure 20D:
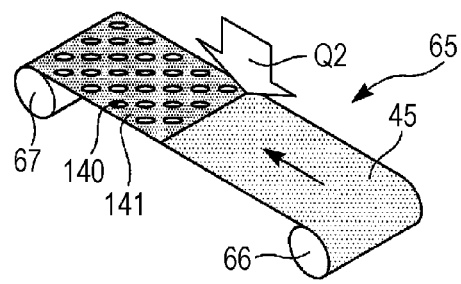
FIG. 20D is a perspective view illustrating a manufacturing procedure of the light diffusion member with a polarizing plate according to the fifth embodiment.

Next, the developing device 65 in FIG. 20D is used to develop the coated layer of the transparent negative resist using a special developing fluid Q2, and post-baking is performed at 100° C., thereby forming the light diffusion portions 141 having the hollow portion 142 on one face of the substrate (step S4 in FIG. 10).

Diffused light Q1 is used to perform the exposure in the present embodiment, as illustrated in FIG. 10C, so the transparent negative resist making up the coated layer is exposed radially spreading outwards from a region where the light shielding layer 140 is not formed (openings). Accordingly, the forward-tapered hollow portions 142 are formed. The light diffusion portions 141 are reverse-tapered in their shapes. The inclination angle of the reflecting faces 141c of the light diffusion portions 141 can be controlled by the degree of diffusion of the diffused light.

The substrate of the light diffusion member 106 (light diffusion substrate plate) is completed by the processes of 20A through 20D.

Figure 20E:
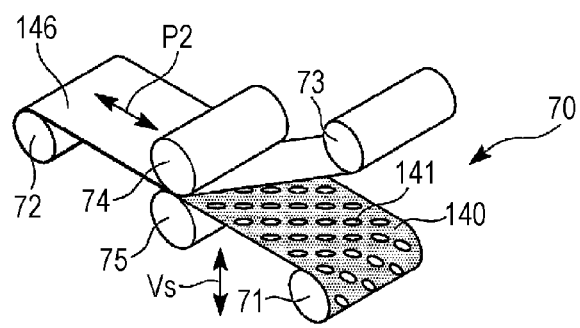
FIG. 20E is a perspective view illustrating a manufacturing procedure of the light diffusion member with a polarizing plate according to the fifth embodiment.

Next, the polarizing plate bonding device 70 illustrated in FIG. 20E is used to bond the substrate of the second polarizing plate 7 onto the light incident end surface 141b of the light diffusion portion 141 in the substrate of the light diffusion member 106, by way of an adhesive agent layer (Step S5 in FIG. 10).

In this process, the transmission axis P2 of the second polarizing plate 7, and the length direction of the substrate of the light diffusion member 106, are made to be generally parallel. That is to say, the azimuthal direction Vs where the diffusion at the light diffusion member 106 is the strongest relatively, and the transmission axis P2 of the second polarizing plate 7, are made to intersect at a generally 45-degree angle.

The bonded article of the substrate of the light diffusion member 106 and the substrate of the second polarizing plate 7 which have been bonded together (hereinafter referred to simply as bonded article 146) is then cut, so as to dice the viewing angle enlarging member 3 into planar view sizes corresponding to the liquid crystal display device 1 (step S6 in FIG. 10). The bonded article 146 is cut along an imaginary cutting line CL so that the azimuthal direction Vs in which the diffusion by the substrate of the light diffusion member 6 is relatively strong, and the short side of the outline of the viewing angle enlarging member 3 after dicing, are generally parallel (matched) (see FIG. 12A).

Finally, the completed viewing angle enlarging member is bonded to the liquid crystal panel 2 using an optical adhesive agent or the like, in a state where the substrate 139 faces the viewing side and the second polarizing plate 7 faces the liquid crystal panel 2.

The above-described process completes the liquid crystal display device according to the present embodiment.

In the present embodiment as well, the azimuthal direction Vs in which the diffusion by the light diffusion member 106 is relatively strong, and the short side (azimuthal angle 90 degrees-270 degrees) of the outline of the liquid crystal panel 2, are generally parallel, so a liquid crystal display device with improved contrast and excellent display quality can be provided.

(Sixth Embodiment)

Figure 21:
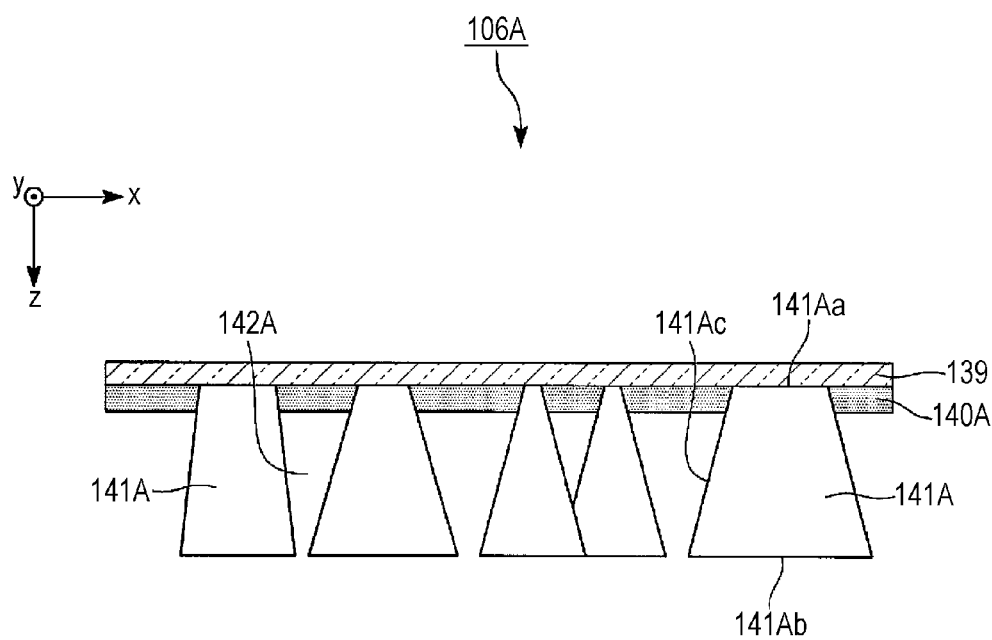
FIG. 21 is a cross-sectional view of a light diffusion member according to a sixth embodiment.

FIG. 21 is a cross-sectional view of a light diffusion member 106A according to a sixth embodiment.

In the first embodiment, the inclination angle of the reflecting faces of the light diffusion portions 141 were all the same. In contrast, the light diffusion member 106A according to the present embodiment has different inclination angles of reflecting faces 141Ac of light diffusion portions 141A, as illustrated in FIG. 21. That is to say, looking at the light diffusion portions 141A overall, the openings at the light-emitting end surface sides of the hollow portions of the light diffusion portions 141A have multiple types of dimensions, and the reflecting faces 141Ac of the light diffusion portions 141A have multiple types of inclination angles. Due to the inclination angles of the reflecting faces 141Ac of the light diffusion portions 141A being different, the dimensions of light incident end surfaces 141Ab also differ. Other configurations are the same as in the first embodiment.

The contrast ratio can be improved in the viewing angle enlarging member having the light diffusion member 106A according to the present embodiment as well. Also, a liquid crystal display device having the viewing angle enlarging member and having excellent display quality can be provided.

(Seventh Embodiment)

Figure 22A:
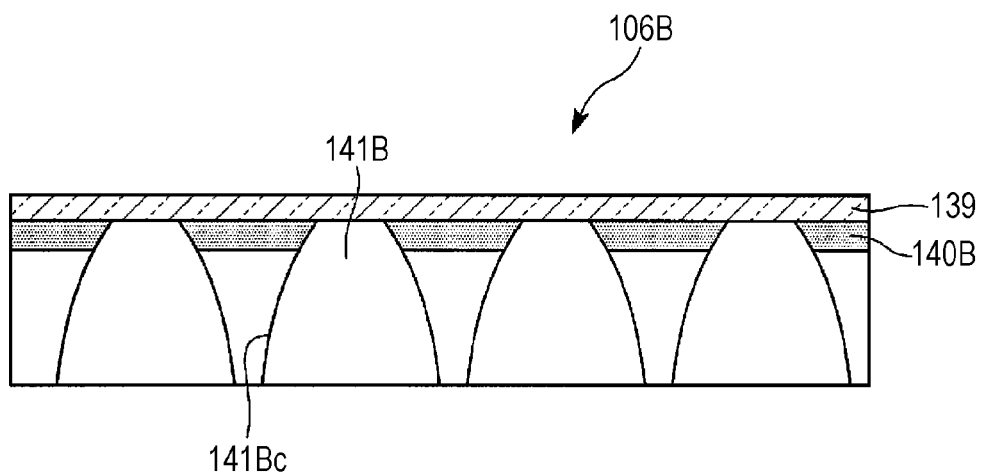
FIG. 22A is a cross-sectional view of a light diffusion member according to a seventh embodiment.
Figure 22B:
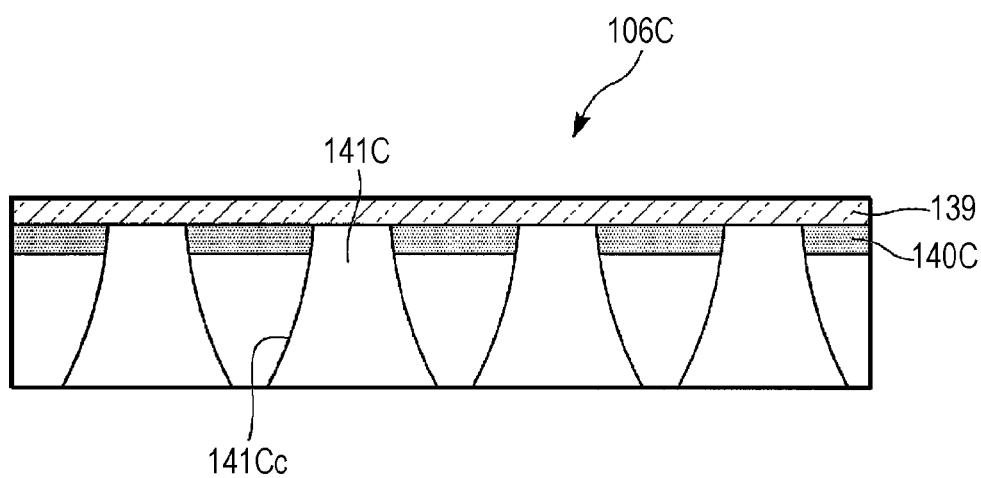
FIG. 22B is a cross-sectional view of a light diffusion member according to the seventh embodiment.

FIG. 22A and FIG. 22B are cross-sectional views of a light diffusion member 106B and light diffusion member 106C according to a seventh embodiment.

In the fifth embodiment, the inclination angle of the reflecting faces 141c of the light diffusion portions 141 was constant in the thickness direction. In contrast, inclination angles of reflecting faces 141Bc and 141Cc of the light diffusion portions 141B and 141C according to the present embodiment differ depending on the location in the thickness direction, as illustrated in FIG. 22A and FIG. 22B. Specifically, the inclination angles of the reflecting faces 141Bc and 141Cc of the light diffusion portions 141B and 141C according to the present embodiment change continuously.

In the light diffusion member 106B illustrated in FIG. 22A, the reflecting face 141Bc of the light diffusion portions 141B curves outwards.

In the light diffusion member 106C illustrated in FIG. 22B, the reflecting face 141Cc of the light diffusion portions 141C curves inwards.

According to the configuration of the present embodiment, light diffusion can be increased as compared to the configuration according to the fifth embodiment.

(Eighth Embodiment)

Figure 23A:
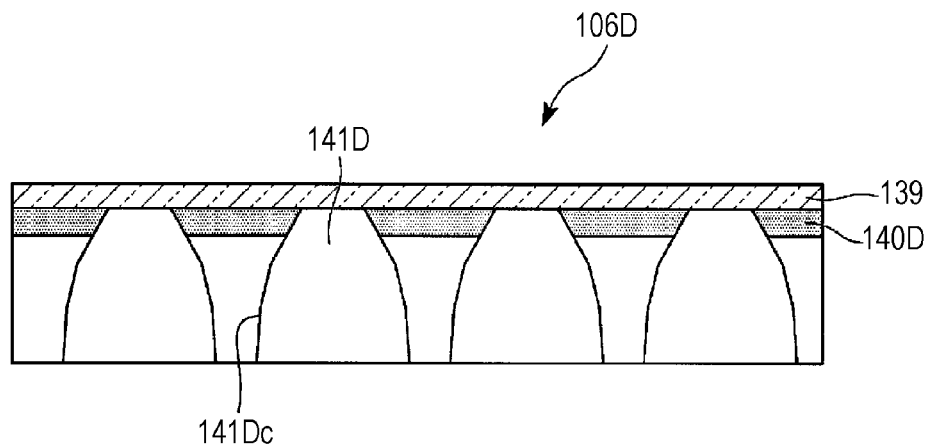
FIG. 23A is a cross-sectional view of a light diffusion member according to an eighth embodiment.
Figure 23B:
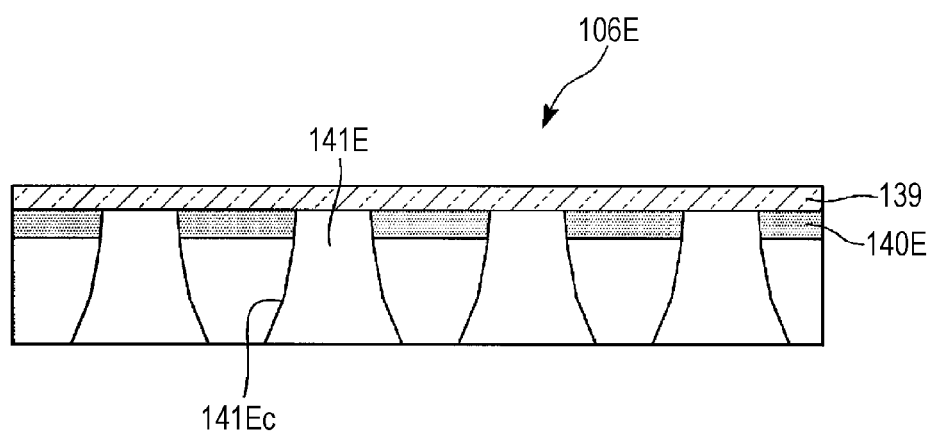
FIG. 23B is a cross-sectional view of a light diffusion member according to the eighth embodiment.

FIG. 23A and FIG. 23B are cross-sectional views of a light diffusion member 106D and light diffusion member 106E according to the present embodiment.

In the fifth embodiment, the inclination angle of the reflecting faces 141c of the light diffusion portions 141 was constant in the thickness direction. In contrast, inclination angles of reflecting faces 141Dc and 141Ec of the light diffusion portions 141D and 141E according to the present embodiment differ depending on the location in the thickness direction, as illustrated in FIG. 23A and FIG. 23B. Specifically, the reflecting faces 141Dc and 141Ec of the light diffusion portions 141D and 141E have multiple different inclination angles (inclination angles with a broken-line cross-sectional shape).

In the light diffusion member 106D illustrated in FIG. 23A, the reflecting face 141Dc of the light diffusion portions 141D has three inclined faces with different inclination angles, protruding outwards.

In the light diffusion member 106E illustrated in FIG. 23B, the reflecting face 141Ec of the light diffusion portions 141E has three inclined faces with different inclination angles, protruding inwards.

According to the configuration of the present embodiment, light diffusion can be increased as compared to the configuration according to the fifth embodiment.

(Ninth Embodiment)

A ninth embodiment of the present invention will be described below with reference to FIG. 24, FIG. 25A, and FIG. 25B.

The basic configuration of the liquid crystal display device according to the present embodiment is the same as that of the first embodiment, and differs from the first embodiment with regard to the point that a viewing angle enlarging member 203 is provided with a refractive index adjusting layer 243. Accordingly, the viewing angle enlarging member 203 will be described in the present embodiment.

Figure 24:
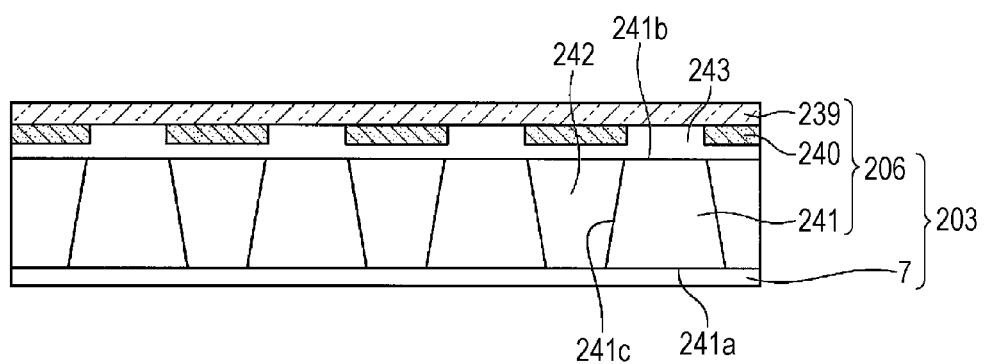
FIG. 24 is a cross-sectional view of a light diffusion member with a polarizing plate according to a ninth embodiment.
Figure 25A:
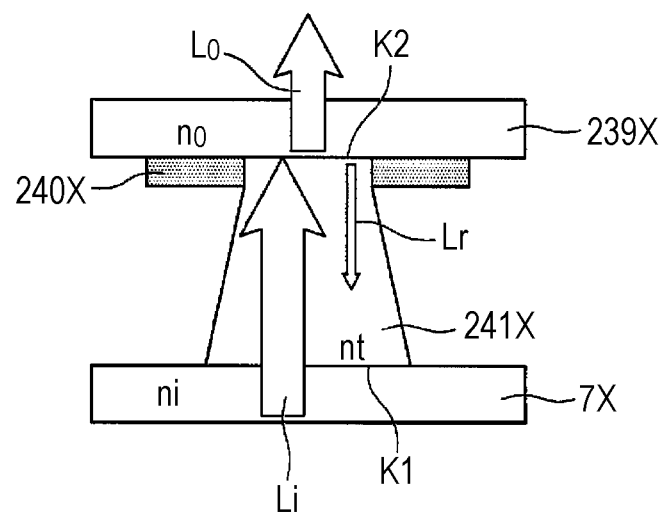
FIG. 25A is a diagram for describing the effects of a light diffusion member with a polarizing plate according to a comparative example.
Figure 25B:
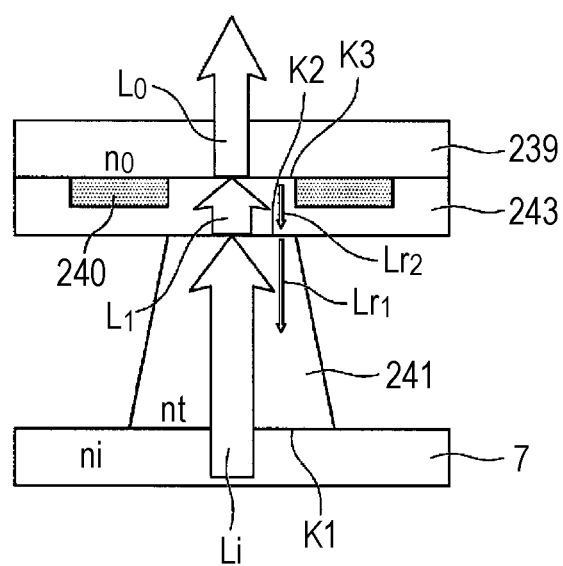
FIG. 25B is a diagram for describing the effects of a light diffusion member with a polarizing plate according to the ninth embodiment.

FIG. 24 is a cross-sectional view of the viewing angle enlarging member 203.

The refractive index adjusting layer 243 is provided on the entire face of one face of a substrate 239, so as to cover a light shielding layers 240. The refractive index adjusting layer 243 is configured using a light-transmitting organic material, such as acrylic resin, epoxy resin, or the like, for example. As one example of the present embodiment, the refractive index adjusting layer 243 is configured using acrylic resin having a refractive index of 1.57. The refractive index of the refractive index adjusting layer 243 is set so as to be smaller than the refractive index of the substrate 239 and also larger than the refractive index of the light diffusion portion 241 and the refractive index of the second polarizing plate 7. In other words, the refractive index adjusting layer 243 having a refractive index between that of the second polarizing plate 7 and the substrate 239 is disposed between the second polarizing plate 7 and the substrate 239. The refractive index adjusting layer 243 according to the present embodiment corresponds to the "member . . . having a refractive index between the refractive index of the polarizing plate and the refractive index of the substrate" according to the Claims.

The refractive index adjusting layer 243 may be configured using just one type of material, or may configured using two or more types of materials having different refractive indexes, to set the refractive index according to the above-described relationship. The refractive index adjusting layer 243 covers the light shielding layers 240, and the surface (face opposite to the substrate 239) thereof is a smooth face.

The effects of the viewing angle enlarging member 203 according to the present embodiment will be described with reference to FIG. 25A and FIG. 25B.

Now, consideration will be given to a liquid crystal display device according to a comparative example which does not have the refractive index adjusting layer 243. The configuration of the liquid crystal display device according to the comparative example is the same as that of the display device according to the present embodiment, except that it does not have the refractive index adjusting layer 243. In this case, light Li emitted from the liquid crystal panel passes through a second polarizing plate 7X, a light diffusion portion 241X, and a substrate 239X, in that order, and is emitted to the observer side. The refractive index ni of the second polarizing plate 7X is 1.50, and the refractive index nt of the light diffusion portion 241X is 1.50, so there no occurrence of interface reflection at the interface K1 of the second polarizing plate 7X and light diffusion portion 241X. However, the refractive index nt of the light diffusion portion 241X is 1.50, and the refractive index no of the substrate 239X is 1.65, so interface reflection occurs at the interface K2 of the light diffusion portion 241X and substrate 239X, and light transmissivity deteriorates.

According to simulation performed by the present inventor, light Lr which is 0.23% of the light perpendicularly entering the interface K2 of the light diffusion portion 241X and substrate 239X reflects at the interface. Accordingly, the transmissivity of the light Lo drops to 99.77%.

Conversely, in the liquid crystal display device according to the present embodiment, light Li emitted from the liquid crystal panel 2 passes through the second polarizing plate 7, the light diffusion portion 241, the refractive index adjusting layer 243, and the substrate 239, in that order, and is emitted to the observer side. The refractive index ni of the second polarizing plate 7 is 1.50, and the refractive index nt of the light diffusion portion 241 is 1.50, so there no occurrence of interface reflection at the interface K1 of the second polarizing plate 7 and light diffusion portion 241. The refractive index nt of the light diffusion portion 241 is 1.50, and the refractive index n1 of the refractive index adjusting layer 243 is 1.57, so slight interface reflection occurs at the interface K2 of the light diffusion portion 241 and the refractive index adjusting layer 243. The refractive index n1 of the refractive index adjusting layer 243 is 1.57, and the refractive index no of the substrate 239 is 1.65, so slight interface reflection occurs at the interface K3 of the refractive index adjusting layer 243 and the substrate 239.

According to simulation performed by the present inventor, light Lr1 which is 0.06% of the light perpendicularly entering the interface K2 of the light diffusion portion 241 and refractive index adjusting layer 243 reflects at the interface. In the same way, light Lr2 which is 0.06% of the light L1 perpendicularly entering the interface K3 of the refractive index adjusting layer 243 and the substrate 239 reflects at the interface. Accordingly, the transmissivity of the light Lo is 99.89%, which is higher than the comparative example.

According to the viewing angle enlarging member 203 according to the present embodiment, the refractive index adjusting layer 243 having a refractive index between the refractive index of the second polarizing plate 7 and the refractive index of the substrate 239 is inserted between the substrate 239 and the light diffusion portion 241 to reduce the difference in refractive index at the interface, thereby reducing interface reflection. As illustrated in FIG. 25A and FIG. 25B, the comparative example has one interface where interface reflection occurs, and the present embodiment has two interfaces where interface reflection occurs. With regard to this, the total amount of reflected light according to the present embodiment is less than that of the comparative example. Accordingly, the transmissivity of light improves, and a liquid crystal display device capable of bright display can be realized.

(Tenth Embodiment)

A tenth embodiment of the present invention will be described with reference to FIG. 26 through FIG. 29B.

The basic configuration of the liquid crystal display device according to the present embodiment is the same as that of the first embodiment, and differs from the first embodiment with regard to the point that a light scattering portion 345 is partially formed on the viewing side face of a substrate 339. Accordingly, a light diffusion member 306 will be described in the present embodiment.

Figure 26:
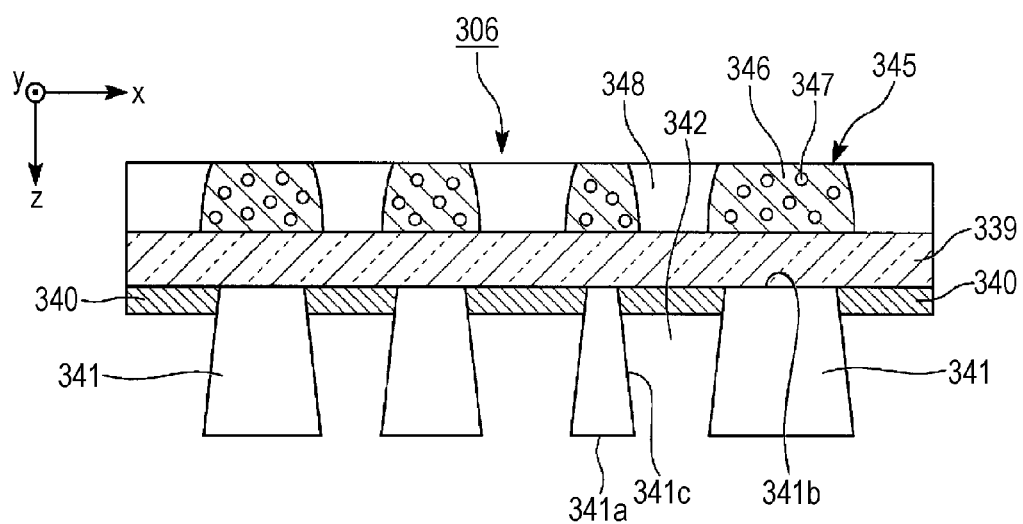
FIG. 26 is a cross-sectional view of a light diffusion member according to a tenth embodiment.

FIG. 26 is a cross-sectional view of the light diffusion member 306.

The light scattering portion 345 is configured as a photosetting resin 346 in which a great number of scattering members 347 have been dispersed. The thickness (dimension in the Z-axis direction) of the light scattering portion 345 is around 20 μm in one example, and the diameter of the spherical scattering members 347 is around 0.5 to 20 μm. The light diffused by a light diffusion portion 341 is isotropically diffused by the light scattering portion 345 and further spread over a wider angle.

The light scattering portion 345 is formed in a layered form in the present embodiment, with multiple holes 348 passing through the layered light scattering portion 345 being formed therein. Specifically, the light scattering portion 345 has multiple holes 348 formed passing through (penetrating) from the viewing side of the light scattering portion 345 to the substrate 39 side. These multiple holes 348 are set such that the area of the holes 348 formed in the light scattering portion 345 at the substrate side is smaller than the area of the light shielding layers 40 coming in contact with the substrate 339. The holes 348 of the light scattering portion 345 are situated so as to be on the inward side of the light shielding layers 340 as seen from the viewing side.

Examples that can be used for the photosetting resin 346 include (meth)acrylate photosetting resins, imide photosetting resins, silicon photosetting resins, and so forth.

Acrylic beads can be used as the scattering members 347 for example, but unrestricted to this, may be configured using a suitable transparent matter such as resin pieces of acrylic polymers, olefin polymers, vinyl polymers, cellulose polymers, amide polymers, fluorine polymers, urethane polymers, silicon polymers, imide polymers, or the like, or glass beads, and so forth.

Scattering members that do not absorb light, or reflecting members, may also be used as the scattering members 347 besides these transparent substances. Alternatively, the scattering members 347 may be air bubbles dispersed throughout the light diffusion portion 341. The shapes of individual scattering members 347 may be formed as various shapes, such as spherical, ellipsoid, plate-shaped, three-dimensional polygonal shapes, or the like, for example. The size of the scattering members 347 may be formed uniform, or non-uniform.

The effects of the light diffusion member 306 according to the present embodiment will be described with reference to FIG. 27A through FIG. 29B.

Figure 27A:
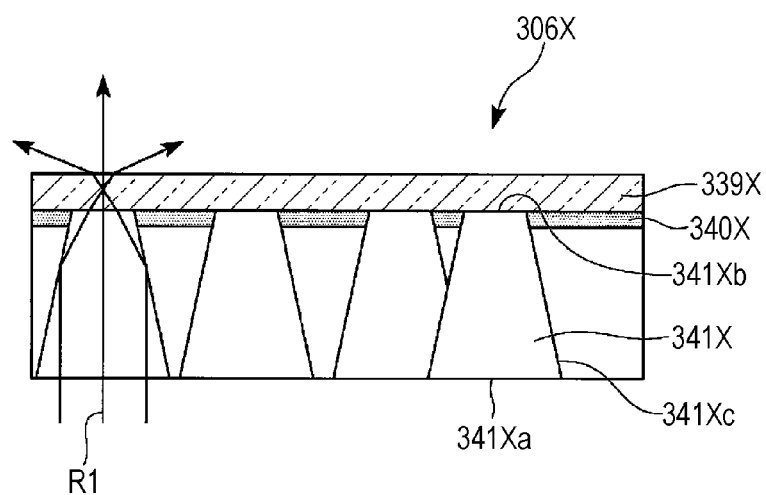
FIG. 27A is a diagram for describing an optical path over which light travels in a case where light a light diffusion portion has not been formed.

As illustrated in FIG. 27A, in a case of a light diffusion member 306X where the light scattering portion 345 has not been provided, light R1 input perpendicularly to a light incident end surface 341Xa from a light diffusion portion 341X is output from a light-emitting end surface 341Xb in a manner concentrated on a particular diffusion angle. As a result, light cannot be uniformly diffused over a wide range, and bright display can be obtained only at a particular viewing angle.

Figure 27B:
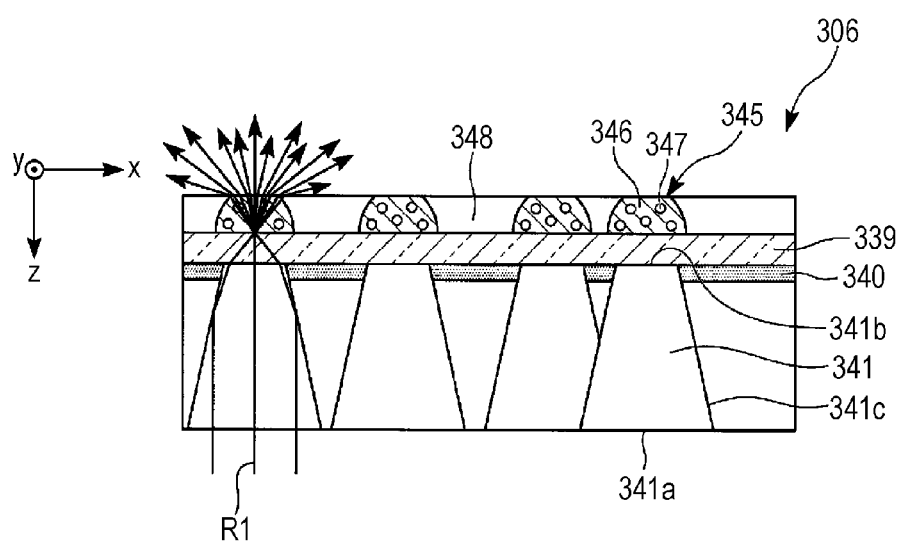
FIG. 27B is a diagram for describing an optical path over which light travels in a case where a light scattering portions has been formed.

In contrast to this, the light scattering portions 345 are disposed on the forefront face of the light diffusion member 306 in the case of the present embodiment, as illustrated in FIG. 27B. Accordingly, the light R1 perpendicularly input to the light incident end surface 341a of the light diffusion portion 341, and diffused at the light diffusion portion 341, is then further diffused at the light scattering portion 345. Accordingly, light is emitted in various angles from the light scattering portions 345.

Thus, in the case of the present embodiment, the light scattering portions 345 are disposed on the forefront face of the light diffusion member 306, so the diffusion angle of light can be prevented from being concentrated on one angle. Accordingly, the light diffusing properties of the light diffusion member 306 can be made to be more moderate, thereby obtaining bright display over a wide viewing angle.

Further, multiple holes 348 continuing from the viewing side to the substrate are formed in the light scattering portion 345 formed at the viewing side face of the substrate 339.

Figure 28A:
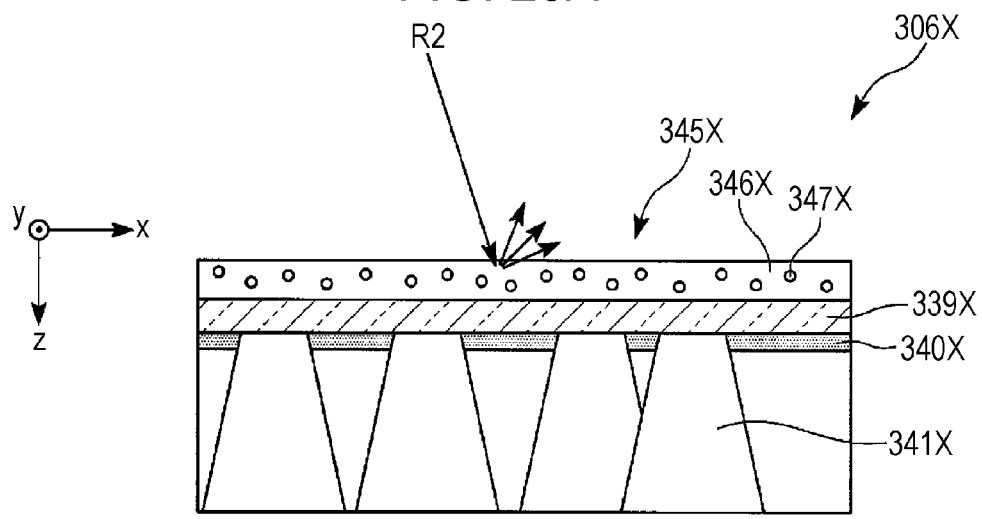
FIG. 28A is a diagram for describing reflection and scattering of external light in a case where a light scattering portion has been formed on the entire face of the substrate.

Now, a case will be considered where a light scattering portion 345X is formed on the entire face of the view side face of the substrate 339. In this case, when light R2 from the viewing side (external light) enters the light scattering portion 345, the external light R2 is reflected and scattered (backscattered) at the light scattering portion 345, and the light travels toward the viewing side, as illustrated in FIG. 28A. The viewer will thus recognize the scattered light of the external light R2, and the visibility of the liquid crystal display device deteriorates.

Figure 28B:
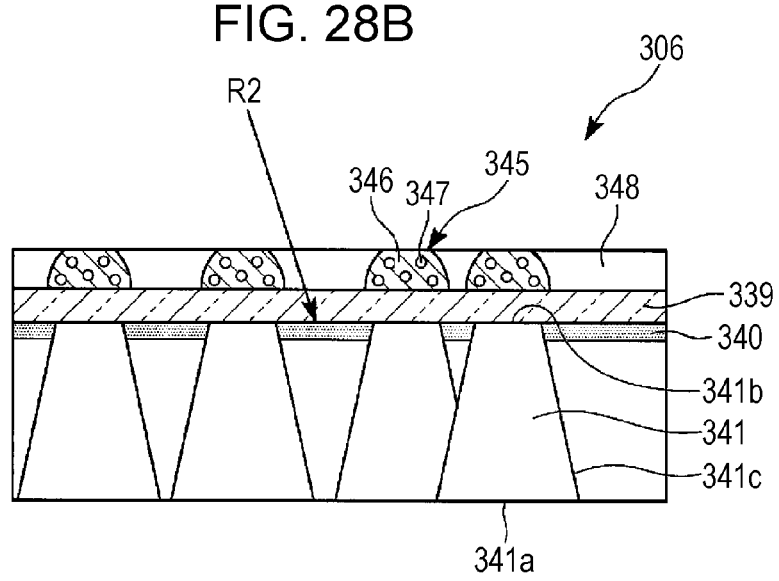
FIG. 28B is a diagram for describing reflection and scattering of external light at a light scattering portion according to the tenth embodiment.

In contrast, in the case of the present embodiment, the holes 348 are formed in the light scattering portion 345 as described above. The light R2 (external light) entering the holes 348 from the viewing side is absorbed by the light shielding layer 340, and does not exhibit reflection scattering, as illustrated in FIG. 28B. Accordingly, reflection scattering of the light R2 from the viewing side can be suppressed as compared with a case where the light scattering portion 345 is formed on the entire face of the substrate 339, and visibility is improved.

Also, the light scattering portions 345 according to the present embodiment are formed at positions facing the light diffusion portions 341 so reflection scattering of light from the viewing side can be suppressed without diminishing light diffusion properties of light from the rear face side. That is to say, according to the light diffusion member 306 of the present embodiment, both light diffusion properties of light from the rear face side, and properties of reflection scattering of light from the viewing side, can be realized.

Further, the area of the holes 348 formed in the light scattering portion 345 at the substrate 339 side is set to be smaller than the area of the light shielding layers 340 where the light scattering portion 345 comes into contact with the substrate 339 in the present embodiment. The holes 348 of the light scattering portion 345 are set to be on the inner side of the light shielding layers 340 as seen from the viewing side (in planar view).

Figure 29A:
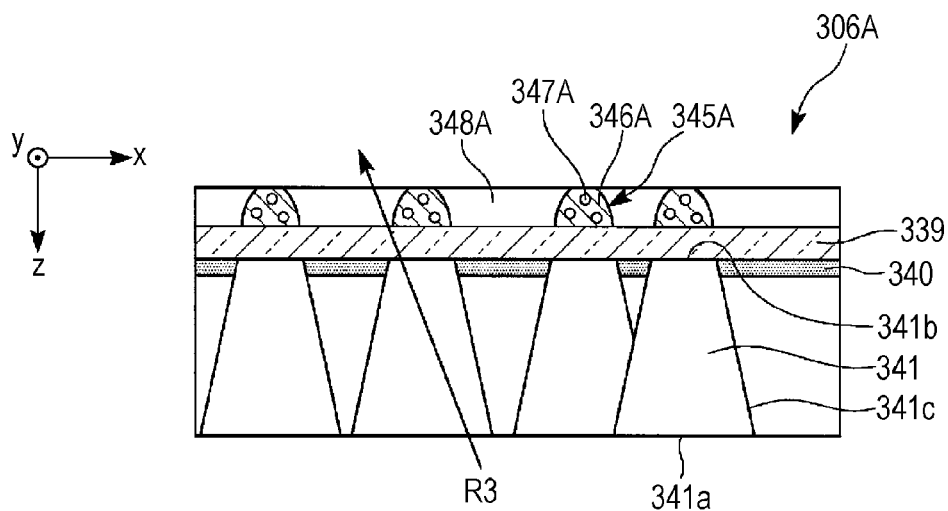
FIG. 29A is a diagram for describing the relationship between light scattering portion formation region and scattered light.

In a case where the area of holes 348A at the substrate 339 side are the same area as the light shielding layers 340 at positions facing the light shielding layers 340, there are cases where light R3 from the rear face side is not scattered by light scattering portions 345A, as illustrated in FIG. 29A.

Figure 29B:
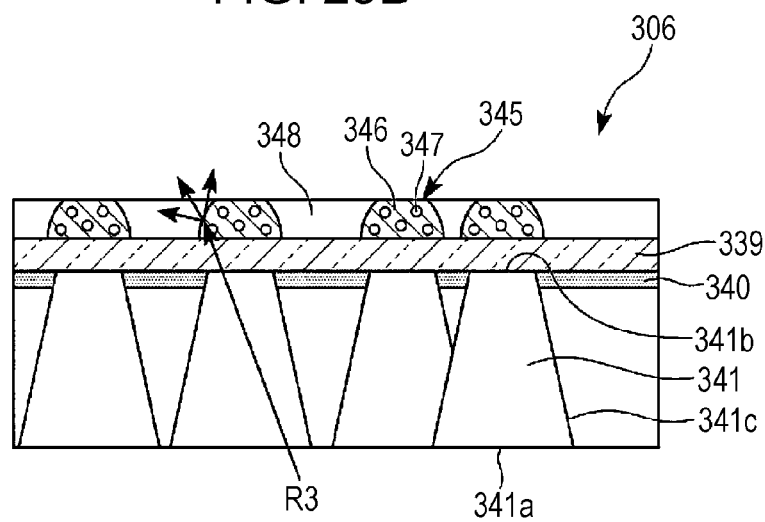
FIG. 29B is a diagram for describing the relationship between light scattering portion formation region and scattered light.

In contrast to this, light R3 obliquely input from the rear face side to the plane of the substrate 339 can be diffused by the light scattering portion 345 in the case of the present embodiment, as illustrated in FIG. 29B. Thus, light diffusion properties can be further improved.

(Eleventh Embodiment)

An eleventh embodiment of the present invention will be described with reference to FIG. 30.

The basic configuration of the liquid crystal display device according to the present embodiment is the same as that of the first embodiment, and differs from the first embodiment with regard to the point that a light scattering portion 445 is partially formed on a face 440a of a light shielding layers 440 on the opposite side from a substrate 439. Accordingly, a light diffusion member 406 will be described in the present embodiment.

Figure 30:
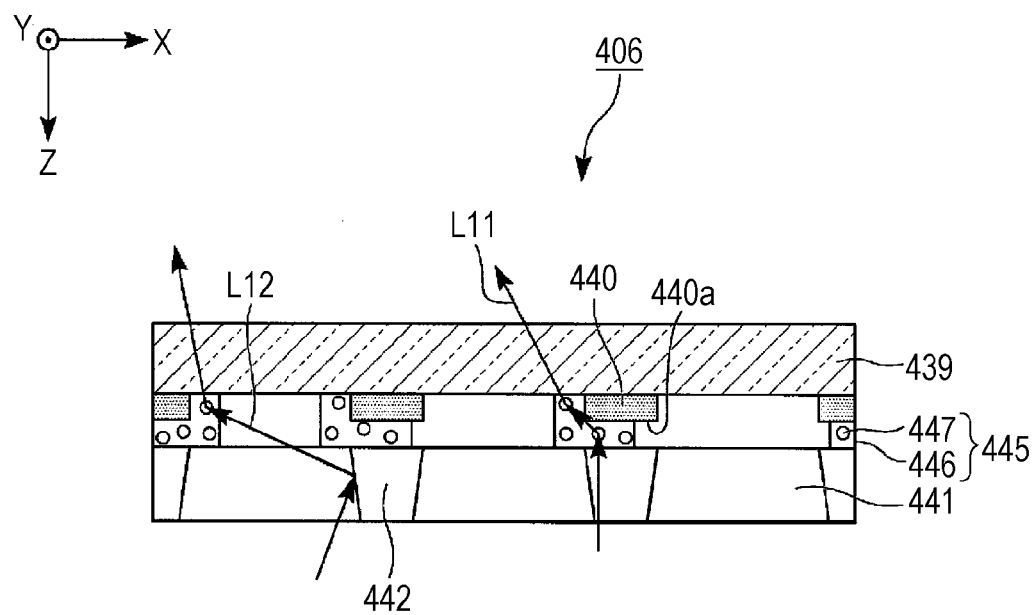
FIG. 30 is a cross-sectional view of a light diffusion member according to an eleventh embodiment.

FIG. 30 is a cross-sectional view of the light diffusion member 406.

The light scattering portions 445 are configured as a photosetting resin 446 in which a great number of scattering members 447 have been dispersed. The light scattering portions 445 are disposed between the hollow portions 442 and the light shielding layers 440. The light scattering portions 445 are disposed on one face of the substrate 439 (the face of the side opposite to the viewing side), covering the light shielding layers 440 so as to be partly exposed. That is to say, as seen from the viewing side (in plan view), part of the light shielding layers 440 protrude out from the regions where the light scattering portions 445 are formed in the present embodiment.

In the case of the present embodiment, a partial light L11 input to a hollow portion 442 enters the light scattering portion 445 and exhibits forward scattering, and thus is guided to a region where the light shielding layer 440 is not formed.

Accordingly, the light diffusion member 406 can emit part of the incident light to the hollow portions 442 in various angles via the substrate 439, and thus can yield high light usage efficiency. Further, the light diffusion member 406 can scatter partial light L12 entering the light diffusion portion 441 within the light scattering portion 445, and thus can emit the light to the substrate 439 at various angles.

Note that while description has been made in the present embodiment regarding an example where part of a face of the light shielding layers opposite to the substrate is covered by light scattering portions, this is not restrictive. For example, a light scattering portion may cover the entire face of the light shielding layers. That is to say, it is sufficient for at least part of the face of the light shielding layers on the side opposite to the substrate to be covered by light scattering portions.

Figure 31A:
FIG. 31A is a plan view illustrating another example of a light shielding layer of the light diffusion member.

Although the shape of the light shielding layers 40 has been described as being a slender elliptical shape in the first embodiment, as illustrated in FIG. 31A, the shape of the light shielding layer 40 is not restricted to this.

Figure 31B:
FIG. 31B is a plan view illustrating another example of a light shielding layer of the light diffusion member.

For example, a light shielding layer 40G having a slender rectangular shape may be used, as illustrated in FIG. 31B.

Figure 31C:
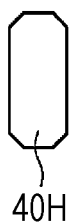
FIG. 31C is a plan view illustrating another example of a light shielding layer of the light diffusion member.

Alternatively, a light shielding layer 40H having a slender octagonal shape may be used, as illustrated in FIG. 31C.

Figure 31D:
FIG. 31D is a plan view illustrating another example of a light shielding layer of the light diffusion member.
Figure 31E:
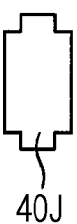
FIG. 31E is a plan view illustrating another example of a light shielding layer of the light diffusion member.
Figure 31F:
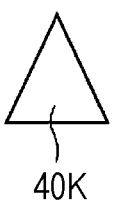
FIG. 31F is a plan view illustrating another example of a light shielding layer of the light diffusion member.
Figure 31G:
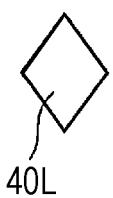
FIG. 31G is a plan view illustrating another example of a light shielding layer of the light diffusion member.

Alternatively, a light shielding layer 40I having a shape where two opposing sides of a slender rectangle are curved outwards may be used, as illustrated in FIG. 31D. Alternatively, a light shielding layer 40J having a shape where two rectangles, having different aspect ratios, are intersected in two orthogonal directions, may be used, as illustrated in FIG. 31E. Alternatively, a light shielding layer 40K having an isosceles triangle shape may be used, as illustrated in FIG. 31F. Alternatively, a light shielding layer 40L having a diamond shape may be used, as illustrated in FIG. 31G. Further, the shapes in FIG. 31A through FIG. 31G may be rotated in a predetermined direction.

Also, the planar shapes of the light shielding layers 40 may each be different, so that multiple types of sizes and shapes having various anisotropic directions (see FIG. 31A through FIG. 31G) coexist.

Even in a case where the planar shapes of the light shielding layers 40 are made to differ, so as to have various anisotropic directions, it is sufficient to set the azimuthal direction Vs in which the diffusion by the light diffusion member 6 is relatively strong and the transmission axis P2 of the second polarizing plate 7 so as to be generally parallel. Accordingly, the contrast ratio can be improved and high display quality obtained even in configurations having various anisotropic directions.

Although the shape of the light diffusion portions 141 has been described as being a slender elliptical shape in the fifth embodiment, as illustrated in FIG. 31A, the shape of the light diffusion portions 141 is not restricted to this.

For example, the shape of the light diffusion portions 141 may be a slender rectangular shape, a slender octagonal shape, a shape where two opposing sides of a slender rectangle are curved outwards, a shape where two rectangles, having different aspect ratios, are intersected in two orthogonal directions, an isosceles triangle shape, a diamond shape, and shapes where these shapes have been rotated in a predetermined direction, may be used, as illustrated in FIG. 31B through FIG. 31G.

Also, the planar shapes of the light diffusion portions 141 may each be different, so that multiple types of sizes and shapes having various anisotropic directions (see FIG. 31A through FIG. 31G) coexist.

Even in a case where the planar shapes of the light shielding layers 40 are made to differ, so as to have various anisotropic directions, it is sufficient to set the azimuthal direction Vs in which the diffusion by the light diffusion member 6 is relatively strong and the transmission axis P2 of the second polarizing plate 7 so as to be generally parallel. Accordingly, the contrast ratio can be improved and high display quality obtained even in configurations having various anisotropic directions.

Also, at least one of a reflection preventing layer, a polarization filter layer, an electric charge preventing layer, a glare preventing layer, and a soiling preventing layer, may be provided on the viewing side of the viewing angle enlarging member at the side of the substrate member in the above-described embodiments.

According to this configuration, functions of reducing reflection of external light, functions of preventing dust and grime from adhering, functions of preventing scratching, and so forth, can be added in accordance with the type of layer provided at the viewing side of the substrate, thereby preventing deterioration over time of the viewing angle properties.

Note that the technical scope of the present invention is not restricted to the above-described embodiments, and that various modifications may be made without departing from the essence of the present invention.

Although the shapes of the light diffusion portion or hollow portions have been described as being elliptical frustums in the above-described embodiments, other shapes may be used. Also, the inclination angle of the reflecting faces of the light diffusion portion does not have to be symmetrical across the optical axis. In a case where the shape of the light diffusion portion is an elliptical frustum as in the above-described embodiments, the inclination angles of the reflecting faces of the light diffusion portions are symmetrical across the optical axis, so a linearly symmetrical angle distribution across the optical axis is obtained.

Conversely, in a case where an asymmetrical angle distribution is intentionally demanded in accordance with the usage and way of use of the display device, for example in a case where there is demand to expand the viewing angle just to the upper side of the screen, or to the right side, the inclination angles of the reflecting faces of the light diffusion portions may be asymmetrical.

Also, while a manufacturing method of the liquid crystal display device has been described in the above embodiments where the completed viewing angle enlarging member is bonded to the liquid crystal panel using an optical adhesive agent of the like, in a state with the substrate facing the viewing side and the second polarizing plate facing the liquid crystal panel, this is not restrictive. For example, the light diffusion member may be applied to the liquid crystal panel with a polarizing plate from the rear. In this case, the azimuthal direction Vs in which the diffusion by the light diffusion member is relatively strong, and the transmission axis P2 of the second polarizing plate, are made to be generally parallel (matched).

Other specific configurations relating to the materials, number, placement, and so forth, of the components of the liquid crystal display device, are not restricted to the above-described embodiments, and may be changed as appropriate. For example, while an example has been illustrated in the above embodiments where polarizing plates are disposed on the outer side of the liquid crystal panel, a configuration may be made instead where a polarizing layer is formed on the inner side of the pair of substrates making up the liquid crystal panel.

INDUSTRIAL APPLICABILITY

The present invention is applicable to various types of display devices, such as liquid crystal display devices, organic electro-luminescence display devices, plasma displays, LED displays, MEMS displays, and so forth.

REFERENCE SIGNS LIST 1, 1A, 1B, 1C liquid crystal display device (display device)
2 liquid crystal panel (display)
3, 203 viewing angle enlarging member (light diffusion member with polarizing plate)
6, 6A, 6B, 6C, 106, 106A, 106B, 106C, 106D, 106E, 206, 306, 406 viewing angle enlarging member
7 second polarizing plate (polarizing plate)
11 liquid crystal layer
39, 139, 239, 339, 439 substrate
40, 40G, 40H, 40I, 40J, 40K, 40L, 140, 140A, 140B, 140C, 140D, 140E, 240, 340, 440 light shielding layer
41, 141, 141A, 141B, 141C, 141D, 141E, 241, 341, 441 light diffusion portion
41a, 141a, 141Aa, 241a, 341a light-emitting end surface
41b, 141b, 141Ab, 241b, 341b light incident end surface
41c, 141c, 141Ac, 141Bc, 141Cc, 141Dc, 141Ec, 241c, 341c reflecting face
42, 142, 242, 442 hollow portion
46, 146 bonded article
243 refractive index adjusting layer (member which has refractive index between refractive index of polarizing plate and refractive index of substrate)
345, 445 light scattering portion
440a face of light shielding layer on opposite side from substrate φ azimuthal angle
Vs azimuthal direction where diffusion at light diffusion member is relatively strong
P2 transmission axis of second polarizing plate (transmission axis of polarizing plate)

The invention claimed is:

1. A light diffusion member comprising:
a rectangular substrate having light transmissivity;
a plurality of light shielding layers formed on one face of the substrate; and
light diffusion portions formed on the one face of the substrate at regions other than regions where the light shielding layers have been formed;
wherein the light diffusion portions have
a light-emitting end surface coming into contact with the substrate,
a light incident end surface which faces the light-emitting end surface and has a larger area than an area of the light-emitting end surface, and
a reflecting face coming into contact with the light-emitting end surface and the light incident end surface, and reflecting light entering from the light incident end surface,
wherein light which enters from the light incident end surface is anisotropically diffused in an azimuth direction seen from a normal direction of the substrate,
wherein a height from the light incident end surface to the light-emitting end surface of the light diffusion portion is greater than a thickness of the light shielding layers,
wherein the azimuth direction where the diffusion by the light diffusion member proper is relatively strong, and any one side making up the outer shape of the substrate, are generally parallel,
wherein a planar shape of the light shielding layers seen from a normal direction of one face of the substrate is an anisotropic shape having at least a major axis and a minor axis,
and wherein a hollow portion sectioned by formation regions of the light diffusion portions is formed in a formation region of the light shielding layers, and air is present in the hollow portion.

2. The light diffusion member according to claim 1, wherein a ratio of a length of the major axis of the light shielding layers to an average length of the minor axis is 1.6 or greater.

3. The light diffusion member according to claim 1, wherein the plurality of light shielding layers have at least one of mutually difference plurality of types of sizes and shapes, as seen from the normal direction of one face of the substrate.

4. The light diffusion member according to claim 1, further comprising
a polarizing plate disposed on an opposite side of the substrate from the light diffusion member,
wherein the azimuth direction where the diffusion by the light diffusion member proper is relatively strong, and a transmission axis of the polarizing plate, do not match.

5. A method of fabricating a light diffusion member with a polarizing plate, the method comprising:
a process of forming a plurality of light shielding layers formed on one face of a rectangular substrate having light transmissivity;
a process of forming a negative photosensitive resin layer having light transmissivity on one face of the substrate to cover the plurality of light shielding layers;

a process of irradiating diffused light as to the negative photosensitive resin layer through the substrate at regions other than formation regions of the light shielding layers, from a face of the substrate at an opposite side face where the light shielding layers and negative photosensitive resin layer have been formed;

a process of developing the negative photosensitive resin layer regarding which irradiation of the diffused light has ended, to form, on the one face of the substrate, light diffusion portions having a light-emitting end surface coming into contact with the substrate, a light incident end surface which faces the light-emitting end surface and has a larger area than the area of the light-emitting end surface, and a reflecting face coming into contact with the light-emitting end surface and the light incident end surface, and reflecting light entering from the light incident end surface, thereby fabricating a light diffusion substrate by which light which enters from the light incident end surface of the light diffusion member is anisotropically diffused in an azimuth direction seen from a normal direction of the substrate; and a process of fabricating a light diffusion member with a polarizing plate by bonding a polarizing plate to the light incident end surface of the light diffusion portion of the light diffusion substrate, thereby forming a bonded article, and thereafter cutting to dice the bonded article, wherein, in the process of fabricating the light diffusion member with the polarizing plate, the bonded article is cut such that the azimuth direction where the diffusion by the light diffusion substrate is relatively strong, and any one side making up the outer shape of the light diffusion member with the polarizing plate after dicing, are generally parallel.

6. The light diffusion member according to claim 4, further comprising:

a member, disposed between the polarizing plate and the substrate, having a refractive index between a refractive index of the polarizing plate and a refractive index of the substrate.

7. The light diffusion member according to claim 4, further comprising:

a light diffusion portion, partially formed on one face of the substrate and an opposite face.

8. The light diffusion member according to claim 4, wherein at least a portion of the substrate and opposite side faces of the light shielding layers is covered by the light diffusion portion.

9. The light diffusion member according to claim 4, wherein at least one of a reflection preventing layer, an electric charge preventing layer, a glare preventing layer, and a soiling preventing layer, is provided on one face of the substrate and an the opposite side face.

10. The method of fabricating a light diffusion member according to claim 5, wherein one of black resin, black ink, ink including ultraviolet absorbing substance that absorbs ultraviolet rays, a simple metal, and a multi-layer film of a simple metal and a metal oxide, is used as a material of the light shielding layer.

11. A display device comprising:

a display; and a viewing angle enlarging member that is disposed on a viewing side of the display and emits light in a state where an angle distribution of light input from the display is wider than that before input, wherein the viewing angle enlarging member is configured including the light diffusion member according to claim 1, the display has a plurality of pixels that make up a display image, and of the plurality of light shielding layers of the light diffusion member, a largest size of the light shielding layers is smaller than a pixel size of the display.

\* \* \* \* \*